(12) United States Patent
Minamitani et al.

(10) Patent No.: US 6,706,130 B1
(45) Date of Patent: Mar. 16, 2004

(54) METHOD AND DEVICE FOR FRICTIONAL CONNECTION AND HOLDING TOOL USED FOR THE FRICTIONAL CONNECTION DEVICE

(75) Inventors: Shozo Minamitani, Ibaraki (JP); Shinji Kanayama, Kashihara (JP); Satoshi Shida, Hirakata (JP); Yasuharu Ueno, Osaka (JP)

(73) Assignee: Matsushita Electric Industrial Co., Ltd., Kadoma (JP)

( * ) Notice: Subject to any disclaimer, the term of this patent is extended or adjusted under 35 U.S.C. 154(b) by 121 days.

(21) Appl. No.: 10/089,843

(22) PCT Filed: Oct. 2, 2000

(86) PCT No.: PCT/JP00/06833

§ 371 (c)(1),
(2), (4) Date: Apr. 4, 2002

(87) PCT Pub. No.: WO01/24963

PCT Pub. Date: Apr. 12, 2001

(30) Foreign Application Priority Data

Oct. 4, 1999 (JP) .............................. 11-283544

(51) Int. Cl.[7] .............................................. B29C 65/06
(52) U.S. Cl. .................. 156/64; 156/73.1; 156/73.5; 156/358; 156/580; 156/580.1; 228/112.1; 228/2.1

(58) Field of Search ...................... 156/64, 73.1, 73.5, 156/285, 358, 580, 580.1, 580.2; 228/110.1, 112.1, 114.5, 1.1, 2.1, 2.3; 264/68

(56) References Cited

U.S. PATENT DOCUMENTS 4,552,609 A * 11/1985 Larsen ...................... 156/358
4,741,788 A *  5/1988 Clark et al. ................. 156/64
4,743,331 A *  5/1988 Nuttall et al. .............. 156/358
5,687,479 A    11/1997 Bennin et al.
5,838,071 A    11/1998 Horibe et al.
5,853,524 A * 12/1998 Nix ......................... 156/358

FOREIGN PATENT DOCUMENTS

| EP | 0 911 812 | 4/1999 |
| JP | 59-208844 | 11/1984 |
| JP | 1-244630  | 9/1989 |
| JP | 6-209032  | 7/1994 |
| JP | 11-307596 | 11/1999 |

* cited by examiner

Primary Examiner—James Sells
(74) Attorney, Agent, or Firm—Wenderoth, Lind & Ponack, L.L.P.

(57) ABSTRACT

When pressurizing and relatively moving the objects to be bonded to each other relative to each other subject their metallic bonding portions to friction bonding for the friction bonding of the metallic bonding portions, the friction bonding operation is temporarily partway reduced or stopped.

24 Claims, 26 Drawing Sheets

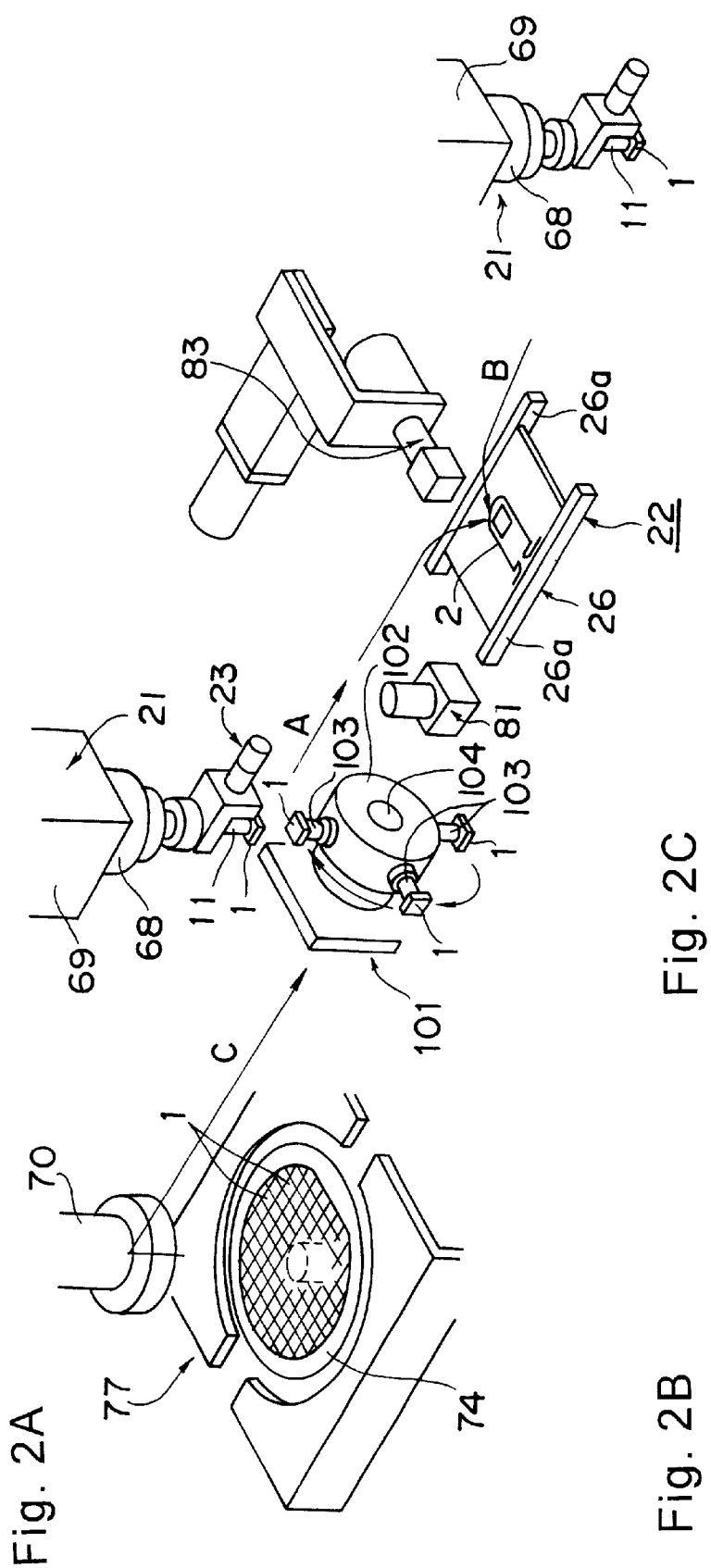

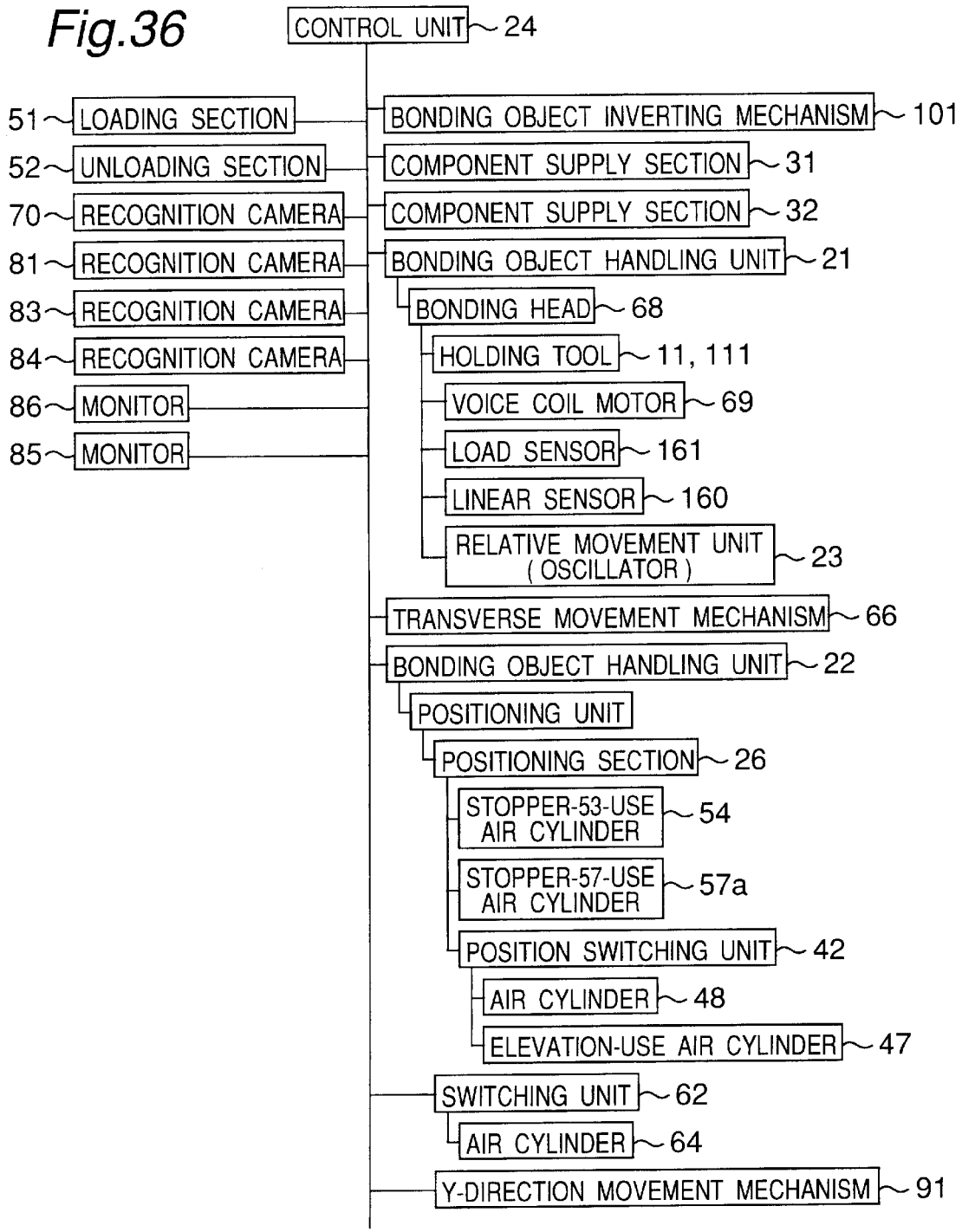

METHOD AND DEVICE FOR FRICTIONAL CONNECTION AND HOLDING TOOL USED FOR THE FRICTIONAL CONNECTION DEVICE

TECHNICAL FIELD

The present invention relates to a friction bonding method and apparatus and a holding tool used for the friction bonding apparatus, and relates to a friction bonding method and apparatus and a holding tool used for the friction bonding apparatus suitable for manufacturing an electronic circuit board and a suspension head by mounting an electronic component on a base member such as a semiconductor element on, for example, a circuit board or a magnetic reading suspension head with metallic bonding when metallically bonding the objects to be bonded to each other.

BACKGROUND ART

For example, with an increasing number of functions of electronic equipment and an increasing number of electronic components, electronic circuit boards tend to receive miniaturized electronic components at increasing mounting densities, and the flip chip mounting technology for mounting electronic components by providing metallic bumps on electrodes formed on a semiconductor wafer and metallically bonding the metallic bumps with a wiring pattern formed on a circuit board is also used for manufacturing an electronic circuit board. This can easily cope with the miniaturization, the fine structure, and the increase in mounting densities of electronic components and connection routes.

The metallic bonding is achieved typically by friction bonding utilizing ultrasonic vibrations. Of course, being not limited to this, the metallic bonding can also be achieved generally by frictional contact with a relative movement.

However, a comparatively strong frictional contact by pressurization and vibratory relative movement is needed for the metallic bonding by frictional contact between minute metallic bonding portions. However, as the semiconductor element becomes more minute, the metallic bumps formed on the element become very small, and the electrodes and wiring portions of the circuit pattern to be metallically bonded to this also become thin. Therefore, the frictional contact is prone to be excessive, possibly damaging the metallic bumps and the circuit pattern, causing a short-circuit as a consequence of the excessive collapse of the metallic bumps striding over the fine circuit pattern and causing defective sealing as a consequence the failure in the entry of the sealant of an excessively reduced gap between the circuit board and the semiconductor element due to the excessive collapse of the metallic bumps. If the frictional contact is reduced in order to avoid the above troubles, then the metallic bonding becomes insufficient, and the semiconductor element, which has been estimated to be bonded, subsequently falls off to make the electronic circuit board defective or causes a failure at an early stage.

Lately, there has been known the technology of using a suspension head 400b constructed of a thin leaf spring for reading a magnetic disk 400a as shown in FIG. 15. The suspension head 400b is supported so that its base portion can be pivoted by a rotary shaft 400c, and read is executed by scanning the magnetic disk 400a with a reading portion 400d located at its tip portion in an arc in the radial direction and rotating the magnetic disk 400a around a spindle 400e. A number of sensing terminals are arranged in the read portion 400d of the suspension head 400b, and a semiconductor element 400f for read is bonded onto wiring lines extended from the sensing terminals to the base portion side of the suspension head 400b.

The semiconductor element 400f is bonded to the base portion side of the suspension head 400b where the width is comparatively large and the wiring interval is increased, and connected to the wiring pattern by way of a bonded wire 400g.

However, with increasing in the read speed, the semiconductor element 400f for read use are demanded to be bonded to a portion in the vicinity of the read portion 400d located at the tip portion of the suspension head 400b. However, since the tip portion of the suspension head 400b is thin and has very small intervals of wiring, it is difficult to perform bonding by wire connection according to the wire bonding method. If it is attempted to cope with this by replacement with the metallic bonding of the semiconductor element 400f provided with metallic bumps, then the semiconductor element 400f is required to have a very small size of not larger than 2-mm square according to circumstances, and a positional accuracy of not greater than $0.3\mu$ is needed for the bonding. Moreover, if foreign materials (particles) adhere to the read portion and the wiring lines of the suspension head 400b as a consequence of the occurrence of silicon powder from the semiconductor element 400f when ultrasonic vibrations are applied to the semiconductor element 400f during friction bonding via a suction tool that sucks and holds the element 400f or for another reason, then the read characteristics of the element are often impaired, reducing the yield.

Such foreign materials are generated not only in the case of a silicon semiconductor element but also in the case of a GaSi semiconductor element. Moreover, the same thing can be said for LiTa, LiNb, and the like used for a SAW (Surface Acoustic Wave) element, and it is also generated in the case of crystal. The foreign materials generated from these materials mean the scrapes, scratches, and chipping of the back surface of the semiconductor element 400f itself, which leads to the roughness and smear of the back surface, solely causing a reduction in quality after bonding. Furthermore, with an increase in the frequency of repetition of bonding by the suction tool, those foreign. materials adhere to the suction surface of the suction tool and gradually accumulate. This also causes the further roughness of the back surface of the semiconductor element 400f to be bonded, worsening the quality of the semiconductor element 400f, and further reducing the yield because of easy occurrence of chipping and cracking of the element inclusive of the electrodes.

In order to cope with this, it is attempted to reduce the ultrasonic output from the normal value of 1 W to 0.1 W or reduce the friction bonding time by ultrasonic waves from the normal value of 0.5 sec to 0.1 sec. However, this attempt tends to cause defective bonding. It is also attempted to clean the suction surface of the suction tool by periodic polishing, the required extra work degrades the productivity, and there is another issue that the operating life of the suction tool is shortened by the abrasion due to polishing.

When bonding the semiconductor elements 400f to the suspension head 400b, a number of suspension heads 400b are arranged parallel so as to integrally extend from a frame portion to the inside of the frame portion, allowing the whole body to be handled as one plate-shaped member. Therefore, the heads can be handled similarly to the circuit board to which electronic components are bonded.

However, each suspension head 400b has its base portion connected to the frame portion by two narrow connecting portions. According to the experiments carried out by the present inventors, the head is thin and easily deformed, and if the head is deformed even a little bit, it is difficult to correct the deformation, leading to a defective product and reduced yield. In particular, it has been difficult to reliably bond the semiconductor element 400f to the suspension head 400b by the friction bonding performed conventionally without the troubles of damage and so on.

The present inventors, who repetitively carried out various experiments and examinations in order to solve this issue, discovered that the proper method was to temporarily reduce or stop the friction bonding operation for metallic bonding partway.

The object of the present invention is to provide a friction bonding method and apparatus capable of performing metallic bonding just enough without damage on the objects to be bonded to each other and a holding tool used for the friction bonding apparatus, on the basis of the aforementioned newly obtained knowledge.

DISCLOSURE OF INVENTION

In order to achieve the aforementioned object, the present invention is constructed as follows.

According to a first aspect of the present invention, there is provided a friction bonding method comprising: temporarily reducing or stopping a friction bonding operation partway when a semiconductor element and a circuit forming body, which are two objects to be bonded to each other, are pressurized against each other and relativity moved to put a plurality of metal electrode portions of the semiconductor element and a plurality of metal electrode portions of the circuit forming body, as metallic bonding portions, into frictional contact with each other so as to perform friction bonding of the metallic bonding portions.

According to a second aspect of the present invention, there is provided a friction bonding method according to the first aspect, wherein the friction bonding operation is temporarily reduced or stopped partway when the metallic bonding portions are frictionally bonded to each other by the frictional contact between the metallic bonding portions by pressurizing and relatively moving the semiconductor element that is one object to be bonded of the two objects to be bonded relative to the circuit forming body that is the other object to be bonded of the two objects to be bonded in a state in which the one object to be bonded is held by a holding tool with the metallic bonding portions of the objects to be bonded facing each other.

According to a third aspect of the present invention, there is provided a friction bonding method according to the second aspect, wherein the holding tool is a suction tool, and the friction bonding operation is temporarily reduced or stopped partway when the metallic bonding portions are frictionally bonded to each other with the metallic bonding portions put into frictional contact with each other by sucking and holding the semiconductor element that is the one object to be bonded of the two objects to be bonded by the holding tool with the metallic bonding portions facing each other and pressurizing and relatively moving the one object to be bonded with respect to the circuit forming body that is the other object to be bonded of the two objects to be bonded.

According to a fourth aspect of the present invention, there is provided a friction bonding method according to any one of the first through third aspects, wherein the relative movement is performed by subjecting the semiconductor element that is the one object to be bonded of the two objects to be bonded to ultrasonic vibrations.

According to a sixth aspect of the present invention, there is provided a friction bonding method according to the third aspect, wherein, when sucking and holding the semiconductor element that is the one object to be bonded by the suction tool, the one object to be bonded is sucked and held by being put in contact with and received by a pair of opposed taper surfaces that is formed on a suction surface of a suction nozzle and able to be brought in contact with an external edge portion of the one object to be bonded.

According to a seventh aspect of the present invention, there is provided a friction bonding method according to any one of the first through sixth aspects, wherein the temporary reduction of the friction bonding operation is performed by reducing the relative movement between the metallic bonding portions.

According to an eighth aspect of the present invention, there is provided a friction bonding method according to any one of the first through sixth aspects, wherein the temporary stop of the friction bonding operation is performed by stopping the relative movement between the metallic bonding portions.

According to a ninth aspect of the present invention, there is provided a friction bonding method according to the seventh or eighth aspect, wherein the temporary reduction or stop of the friction bonding operation is performed by stopping the pressurization between the metallic bonding portions.

According to a 10th aspect of the present invention, there is provided a friction bonding method according to the ninth aspect, wherein the stop of the pressurization is performed by separating the holding tool away from the one object to be bonded held by the tool.

According to an 11th aspect of the present invention, there is provided a friction bonding method according to any one of the first through sixth aspects, wherein the reduction of the friction bonding operation is performed by reducing the relative movement of the objects to be bonded to each other and the pressurization between the metallic bonding portions.

According to a 12th aspect of the present invention, there is provided a friction bonding method according to any one of the first through 11th aspects, wherein an initial friction bonding operation before the reduction or stop is performed by controlling a distance between the objects to be bonded to each other, and a final friction bonding operation after the reduction or stop is performed by controlling the pressurization between the objects to be bonded to each other.

According to a 13th aspect of the present invention, there is provided a friction bonding method according to any one of the first through 11th, wherein an initial friction bonding operation before the reduction or stop is performed by controlling the pressurization between the objects to be bonded to each other, and a final friction bonding operation after the reduction or stop is performed by controlling a distance between the objects to be bonded to each other.

According to a 14th aspect of the present invention, there is provided a friction bonding method according to any one of the first through 13th, wherein an initial friction bonding operation before the reduction or stop is performed for a time shorter than a time of a final friction bonding operation after the reduction or stop.

According to a 15th aspect of the present invention, there is provided a friction bonding method according to any one of the first through 13th, wherein an initial friction bonding operation before the reduction or stop is performed by controlling a distance between the objects to be bonded to each other, and on basis of control data obtained at the time, the distance between the objects to be bonded to each other is controlled during a final friction bonding operation after the reduction or stop.

According to a 16th aspect of the present invention, there is provided a friction bonding method according to any one of the first through 15th aspects, wherein an initial friction bonding operation before the reduction or stop is performed by controlling the pressurization between the objects to be bonded to each other, and on basis of control data obtained at the time, the pressurization between the objects to be bonded to each other is controlled during a final friction bonding operation after the reduction or stop.

According to a 17th aspect of the present invention, there is provided a friction bonding method according to the fourth aspect, wherein the friction bonding operation is temporarily reduced or stopped partway when the metallic bonding portions are frictionally bonded to each other through the frictional contact between the metallic bonding portions by pressurizing and moving one object to be bonded of the two objects to be bonded relative to the other object to be bonded of the two objects to be bonded in a state in which the one object to be bonded is held by a holding tool with the metallic bonding portions of the objects to be bonded facing each other, an impedance of a ultrasonic horn connected to an oscillator attached onto the holding tool is monitored during an initial friction bonding operation before the reduction or stop when performing frictional bonding by the ultrasonic vibrations, and a final friction bonding operation after the reduction or stop is controlled in accordance with the monitored impedance.

According to an 18th aspect of the present invention, there is provided a friction bonding method according to the fourth aspect, wherein the one object to be bonded of the two objects to be bonded is a semiconductor element, and the other object to be bonded of the two objects to be bonded is a magnetic disk reading suspension head constructed of a thin leaf spring.

According to a 19th aspect of the present invention, there is provided a friction bonding apparatus comprising:

two bonding object handling units for holding the semiconductor element by means of a suction tool, holding a circuit forming body which are the two objects to be bonded, and positioning the semiconductor element and the circuit forming body so that their metal electrode portions that is a plurality of metallic bonding portions respectively face each other by holding the semiconductor element and the circuit forming body respectively;

a relative movement unit for respectively bringing the plurality of opposed metallic bonding portions of the two objects to be bonded into frictional contact with each other by relatively moving the objects to be bonded held by the two bonding object handling units; and a control unit, which controls the holding and positioning of the objects to be bonded by the bonding object handling units and the relative movement of the bonding object handling units by the relative movement unit so as to respectively make the plurality of metallic bonding portions of the objects to be bonded held by the bonding object handling units face each other and brings the objects into frictional contact with each other by the relative movement for achievement of respective metallic bonding, the control unit temporarily reducing or stopping the friction bonding operation partway.

According to a 20th aspect of the present invention, there is provided a friction bonding apparatus according to the 19th aspect, wherein movement of one of the bonding object handling units by the relative movement unit is performed by ultrasonic vibrations.

According to a 21st aspect of the present invention, there is provided a friction bonding apparatus according to the 19th or 20th aspect, wherein one object to be bonded of the two objects to be bonded is handled by one bonding object handling unit of the two bonding object handling units, the one object to be bonded is an object to be bonded that has a frame portion and the metallic bonding portion in an inclined portion that extends from the frame portion into the frame portion and is inclined with respect to the frame portion, the one bonding object handling unit has a positioning section for positioning and holding the frame portion of the one object to be bonded, the positioning section can move into a unloading/loading position in which the frame portion of the one object to be bonded is held and guided along its conveyance surface and the one object to be bonded is loaded and unloaded and a bonding position in which the is inclined portion of the one object to be bonded that holds and positions the frame portion is inclined so as to extend along the conveyance surface and the metallic bonding portion located at the inclined portion is subjected to metallic bonding, the one bonding object handling unit further comprises: a position switching unit for performing switching so that the positioning section is moved into the unloading/loading position and the bonding position; and a backup section for performing backup so that the inclined portion of the one object to be bonded positioned by the positioning section is supported from below when the positioning section is switched to the bonding position, and the control unit controls the position switching unit according to the loading, unloading, positioning, and bonding of the one object to be bonded, thereby switching the positioning section between the unloading/loading position and the bonding position.

According to a 22nd aspect of the present invention, there is provided a friction bonding apparatus according to the 21st aspect, wherein the positioning section has a pair of guide rails for conveying and guiding the one object to be bonded, the one object to be bonded is a spring leaf, the inclined portion is formed at a tip portion of the spring leaf extended inside the frame portion, and the positioning section is provided with: a pressurizing member that is supported by one guide rail of the pair of guide rails of the positioning section and able to move between a holding position in which the inclined portion owned by the spring leaf is held between the pressurizing member and the backup section and a holding release position in which the holding is released; and a switching unit that switches the pressurizing member into the holding position and the holding release position between the pressurizing member and the one guide rail, and the control unit controls the switching unit so as to position the pressurizing member in the holding position every time the one object to be bonded is received and positioned in the positioning section and in the holding release position every time the bonding operation ends.

According to a 23rd aspect of the present invention, there is provided a friction bonding apparatus according to the 22nd aspect, wherein a plurality of spring leaves each of which is the one object to be bonded exist inside the frame portion, the pressurizing member is provided with a pressurizing leaf that can hold each spring leaf between the pressurizing member and the backup section while independently covering the spring leaf, the pressurizing leaf holds or releases the holding of the spring leaf, and each pressurizing leaf is provided with a through hole for exposing the metallic bonding portion of the inclined portion of each spring leaf to subject the metallic bonding portion to friction bonding.

According to a 27th aspect of the present invention, there is provided a frictional bonding apparatus according to the 20th aspect, further comprising two bonding object handling units, one bonding object handling unit operable for performing temporary fixation by an initial frictional bonding operation until the reduction or stop of the frictional bonding, and the other bonding object handling unit operable for performing regular fixation by a final frictional bonding operation of the semiconductor element and the circuit forming body after the bonding operation until the reduction or stop of the frictional bonding.

According to a 28th aspect of the present invention, there is provided a frictional bonding apparatus according to the 27th aspect, wherein the one bonding object handling unit for performing the initial frictional bonding operation has a suction tool that has a suction hole for sucking the semiconductor element, and the other bonding object handling unit has an inclined tool that has an inclined surface capable of holding the semiconductor element.

BRIEF DESCRIPTION OF DRAWINGS

These and other aspects and features of the present invention will become clear from the following description taken in conjunction with the preferred embodiments thereof with reference to the accompanying drawings, in which:

FIG. 2A is a perspective view showing the total movement of a bonding object handling unit in an operating state, for a semiconductor element in the friction bonding apparatus of FIG. 1;

FIG. 2B is a sectional view showing a state in which a semiconductor element is sucked and held by the suction tool of the bonding object handling unit of FIG. 2A;

FIG. 2C is a perspective view showing the suction surface of a suction tool as one example of the holding tool of the bonding object handling unit of FIG. 2A, viewed from below;

FIG. 36 is a block diagram of the control unit of the friction bonding apparatus of the first embodiment of the present invention.

BEST MODE FOR CARRYING OUT THE INVENTION

Figure 1:
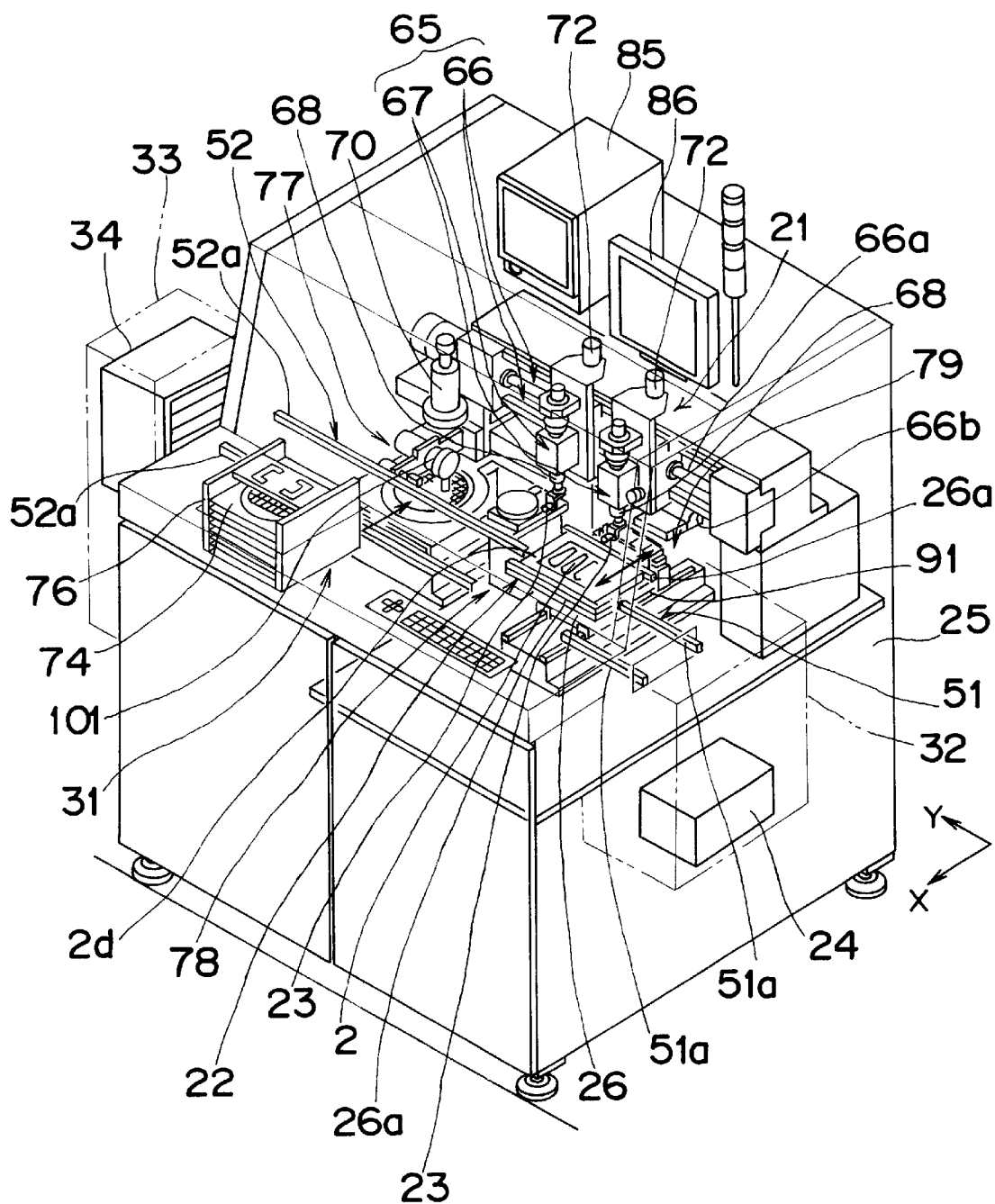
FIG. 1 is an overall schematic view of a friction bonding apparatus according to a first embodiment of the present invention.

Before the description of the present invention proceeds, it is to be noted that like parts are designated by like reference numerals throughout the accompanying drawings.

Embodiments of the present invention will be described in detail below with reference to the drawings.

First Embodiment

The friction bonding method and apparatus of the first embodiment of the present invention and a holding tool used for the friction bonding apparatus will be described in detail below together with the first embodiment referring to FIG. 1 through FIG. 14, for the understanding of the present invention.

Figure 11:
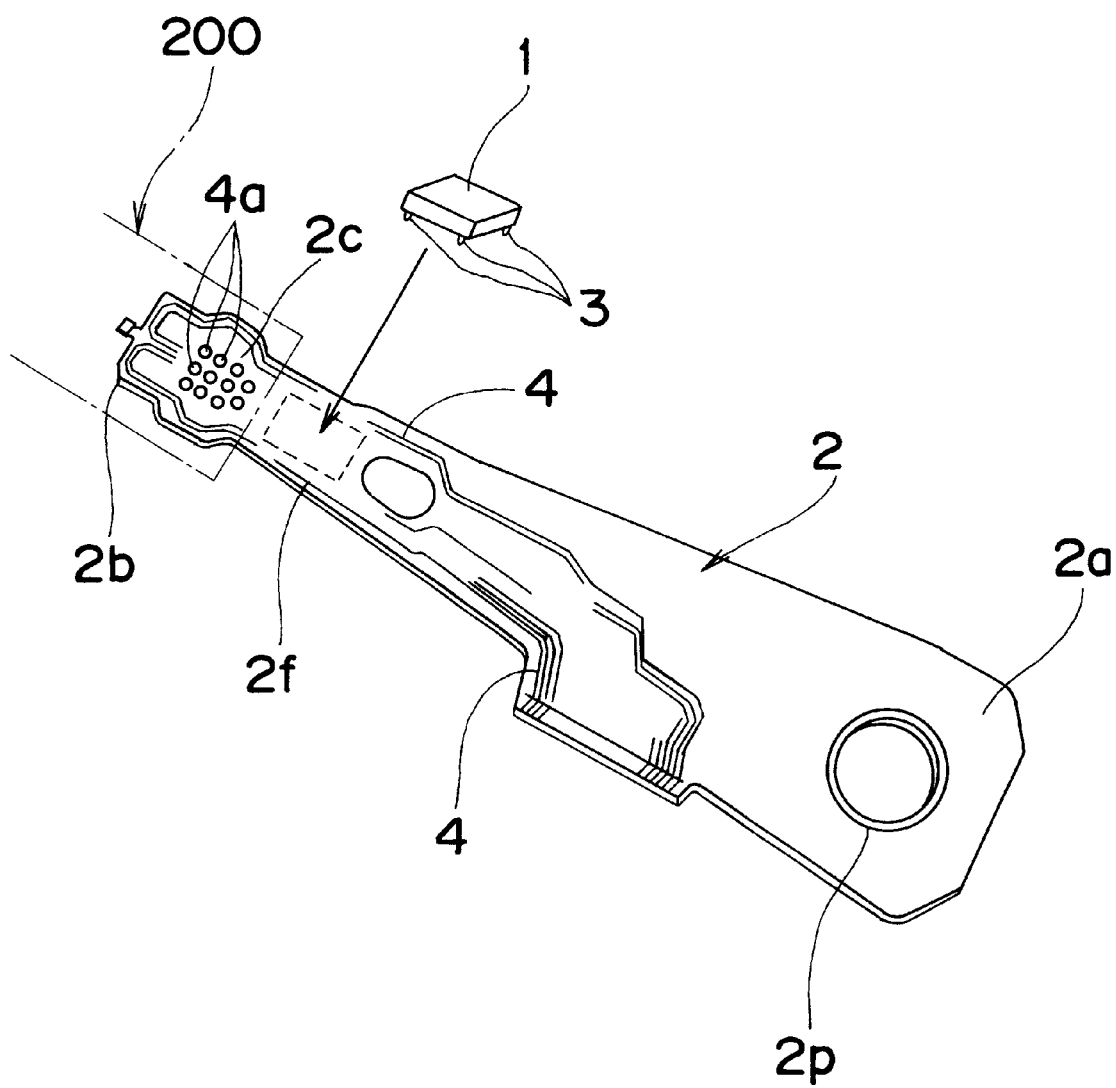
FIG. 11 is a perspective view showing a relation of bonding position between a semiconductor element and a base member, which serve as a pair of objects to be bonded to each other in the first embodiment.
Figure 13:
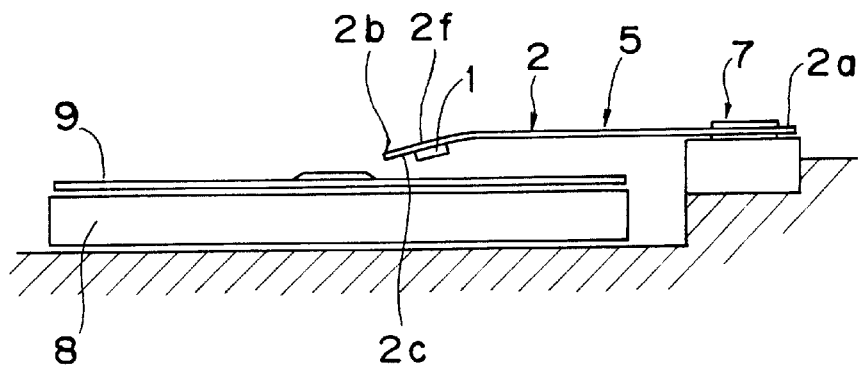
FIG. 13 is a sectional view showing a state in which a magnetic disk is read by a suspension head obtained by frictionally bonding a semiconductor element to a base member by the friction bonding method and apparatus of the first embodiment of the present invention.
Figure 14:
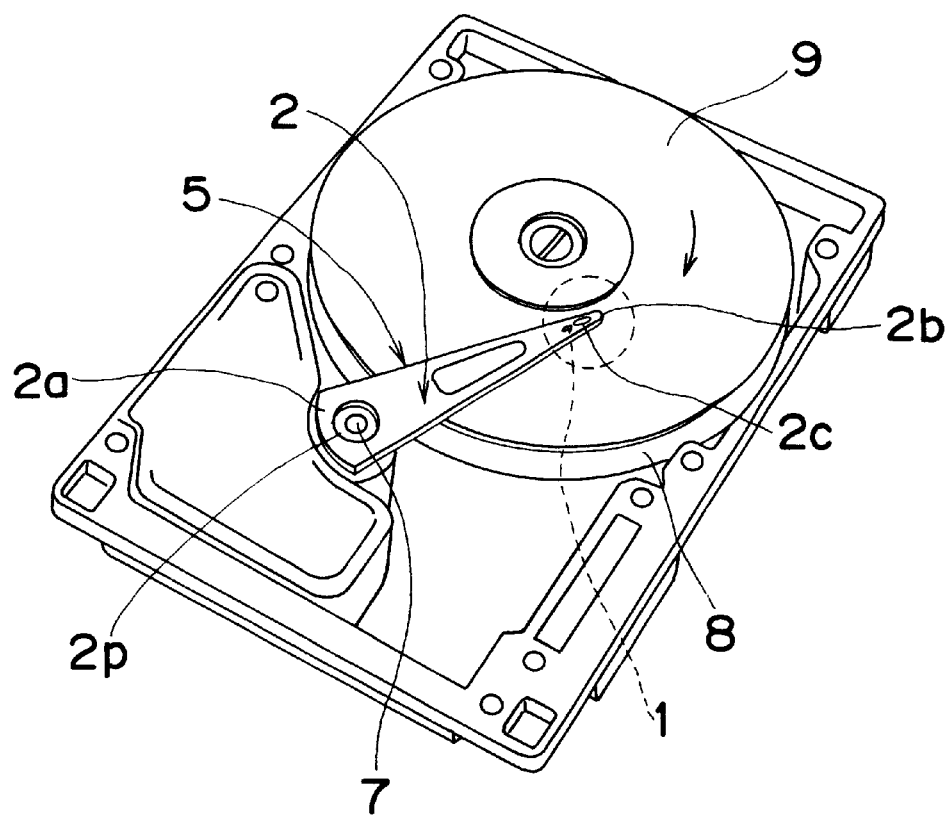
FIG. 14 is a perspective view of FIG. 13.
Figure 15:
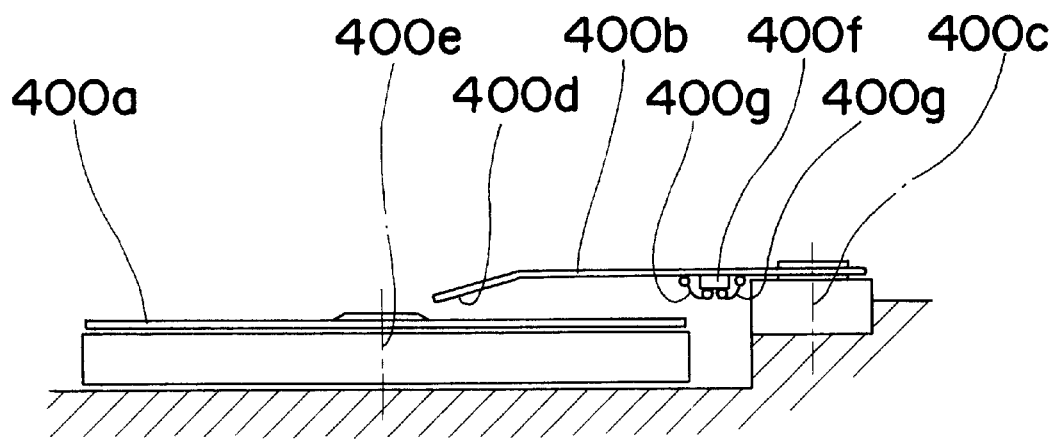
FIG. 15 is a sectional view showing a state in which a magnetic disk is read by a conventional suspension head obtained by frictionally bonding a semiconductor element to a base member.

The first embodiment is one example of the case of manufacturing a suspension head 5 as shown in FIG. 13 and FIG. 14 by principally employing two objects to be bonded together provided by, for example, a flip-chip type semiconductor element 1 as shown in FIG. 1, FIG. 7A, FIG. 7B, and FIG. 11 and a base member 2, which serves as a circuit forming body, of a suspension head for reading a recording medium such as a magnetic disk, as shown in FIG. 11, and relatively moving the metallic bonding portions of metallic bumps 3 and wiring lines (lands, for example) 4, which serve as the metal electrode portions of both of the objects 1 and 2 in the transverse direction, or in other words, along the surface of the base member 2 (for example, in the direction perpendicular to the vertical direction) relative to each other as shown in FIG. 2B for the achievement of friction bonding so that the semiconductor element 1 is bonded to the base member 2.

However, the present invention is not limited to this. The present invention is effective when generally applied to the manufacturing of an electronic circuit board by bonding general electronic components inclusive of a connector and so on to a circuit board and the manufacturing of a variety of secondary products and products by frictionally bonding the metallic bonding portions of various objects to be bonded to each other is performed regardless of the electronic components and circuit boards and regardless of electric components and electrical products.

Figure 7A:
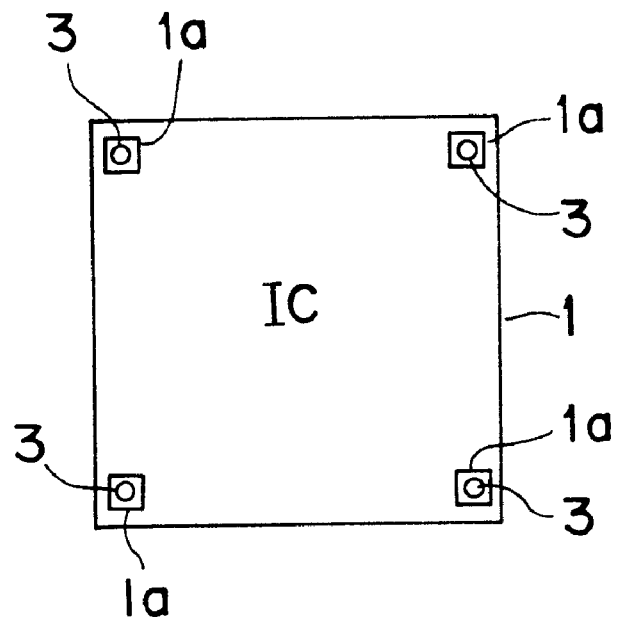
FIG. 7A is a plan view showing a 4-bump semiconductor element having four metallic bumps in a concrete example of the semiconductor element.
Figure 7B:
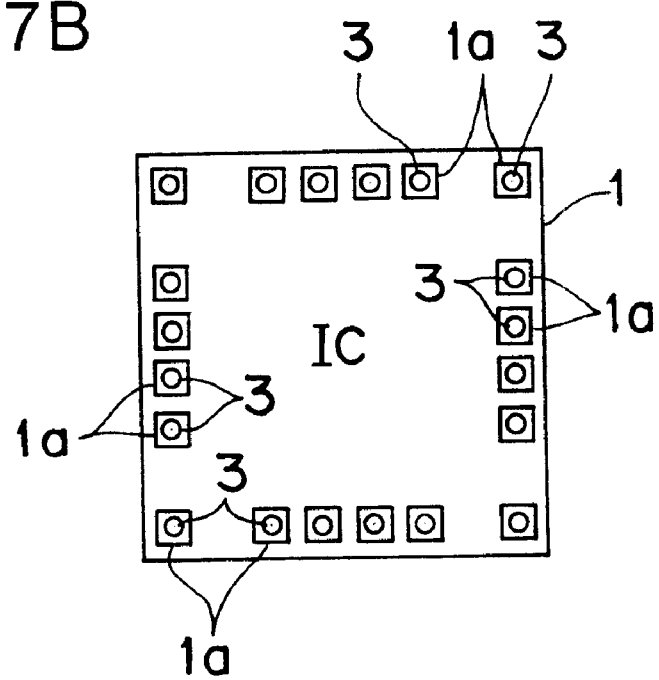
FIG. 7B is a plan view showing a 20-bump semiconductor element having twenty metallic bumps.

The semiconductor element 1 is constructed of, for example, a silicon wafer. In order to produce specified element functions by electrically connecting the wafer with an electronic circuit or the like, the required number of electrodes 1a as shown in FIG. 7A and FIG. 7B are formed, and a metallic bump 3 for the electrical connection is formed on each of the electrodes 1a. The metallic bump 3 is made of a metallic material of gold, aluminum, or the like having satisfactory electrical conductivity and accurately formed by subjecting an end portion of a wire to, for example, welding and diffusion bonding by ultrasonic vibrations and heating and thereafter separating the trail portion. It is to be noted that the semiconductor element 1 is not limited to the silicon wafer and is permitted to be GaSi, LiTa, or LiNb used for a SAW (Surface Acoustic Wave) element or the like.

As shown in FIG. 11, the base member 2 of the suspension head 5 is constructed of a thin spring leaf and has a shape tapered from its base portion 2a toward its tip portion 2b. Metallic dots 4a (sensing terminals) for reading a magnetic disk are densely arranged on one surface of the tip portion 2b to form a read portion 2c, and the metallic bumps 3 of the semiconductor element 1 are metallically bonded to the wiring lines 4 that serves as signal lines extended from this read portion 2c toward the base portion 2a side with a specified relation of correspondence, forming the suspension head 5 that comes to produce the magnetic data read function. As shown in FIG. 13 and FIG. 14, the suspension head 5 has its base portion 2a pivotally supported around the axis of rotation of a rotary shaft 7 by the rotary shaft 7 with the through hole 2p of the base portion 2a fitted around the rotary shaft 7. The read portion 2c faces the magnetic disk 9 on a drive disk 8 so as to scan in the radial direction the magnetic disk 9 rotatively driven, reading and transmitting the magnetic data recorded on the magnetic disk 9.

According to the friction bonding method of the first embodiment, as exemplified in FIG. 2B, by pressurizing and relatively moving the semiconductor element 1 and the base member 2 relative to each other, which are the objects to be bonded to each other so as to bring the metallic bumps 3 and the wiring lines 4, which are their metallic bonding portions, into friction contact, the metallic bumps 3 and the wiring lines 4 are frictionally bonded to each other. This friction bonding operation is temporarily partway reduced or stopped (halted).

The reduction of the friction bonding operation can be achieved by, for example, either stopping (halting) only the relative movement between the semiconductor element 1 and the base member 2 or stopping (halting) only the pressurization when the metallic bumps 3 and the wiring lines 4 are relatively moved with pressurization for the friction. The stop (halt) of the pressurization can be achieved either by releasing the pressurization or only stopping (halting) the progress of the pressurization. Otherwise, the reduction of the friction bonding operation can also be achieved by reducing the degree of one or both of the relative movement of the semiconductor element 1 with respect to the base member 2 and the pressurization between the metallic bumps 3 and the wiring lines 4. The stop (halt) of the friction bonding operation can be achieved by stopping (halting) the relative movement of the semiconductor element 1 with respect to the base member 2 and, when the relative movement is accompanied by pressurization, by stopping (halting) the pressurization.

As described above, if the semiconductor element 1 and the base member 2 are moved relative to each other to bring the metallic bumps 3 and the wiring lines 4 into friction contact, then the metallic bumps 3 and the wiring lines 4 come to have an elevated temperature by the friction and are frictionally bonded to each other with the softening, melting, and diffusion bonding thereof. If this friction bonding operation is temporarily reduced or stopped (halting) partway, then the metallic bumps 3 and the wiring lines 4 and also the semiconductor element 1 and the base member 2 scarcely receive damage due to the reduction in the mechanical and thermal influences, dissimilar to the case of the metallic bonding performed at a stroke. Accordingly, even when the counterpart object to be bonded to which the semiconductor element 1 is to be metallically bonded is the base member 2 constructed of a thin leaf spring of the suspension head 5 for reading the magnetic disk, deformation hardly occurs and high yield results. Furthermore, the shear strength of the metallic bonding portions of the metallic bumps 3 and the wiring lines 4 is rather increased by the reduction or stop (halt) of the friction bonding operation effected partway, and the friction bonding is reliably achieved without trouble.

In this case, if, for example, the semiconductor element 1, which is one of the pair of objects to be bonded to each other, is sucked and held by a suction tool 11, which serves as one example of the holding tool, as shown in FIG. 2A and FIG. 2B, then the element can be easily conveyed from the pickup position to the base member 2 for the temporary bonding and easily handled in a variety of ways. Therefore, the held semiconductor element 1, which is the one object to be bonded, can be pressurized and relatively moved relative to the base member 2, which is the other object to be bonded, with the metallic bumps 3 and the wiring lines 4, which are their metallic bonding portions, facing each other as shown in FIG. 2B, and the base member 2, which is the other object to be bonded, is only required to be positioned in the specified position, simplifying the handling.

Moreover, the aforementioned relative movement is only required to ultrasonically vibrating the semiconductor element 1 and the base member 2, and it is sufficient to apply ultrasonic vibrations to the object to be bonded, or for example, the semiconductor element 1 held by the suction tool 11 via the tool, simply and easily achieving the relative movement. In particular, relative movement can be obtained with a minute and high-speed vibration state by the ultrasonic vibrations, and the friction bonding can sufficiently be performed in a short time without excessive collapse even between the minute metallic bonding portions of the metallic bumps 3 of the semiconductor element 1 and the wiring lines 4 located on the base member 2 for the manufacturing of the suspension head 5.

When sucking and holding the object to be bonded, such as the semiconductor element 1, by the suction tool 11, the semiconductor element 1 is received, sucked, and held by a recess portion that is formed in a recess portion 11b, as shown in FIG. 2B and FIG. 2C, formed on a suction surface 11a of the suction tool 11, similar to the external form of the semiconductor element 1 which is the object to be bonded and sucked and is smaller than the external form, i.e., a square frame-like taper surface 11c capable of coming into tight contact with the four sides of the external edge portions of the quadrilateral upper surface of the semiconductor element 1 capable of coming in contact with the suction surface 11a of the suction tool 11, with the four sides of the quadrilateral upper surface of the semiconductor element 1 brought in tight contact with the taper surface 11c. With this arrangement, the semiconductor element 1, which is the object to be bonded, is received by the taper surface 11c of the recess 11b located at the suction surface 11a with the corner portions of the semiconductor element 1 brought in tight contact with the taper surface 11c when the semiconductor element 1 is sucked by the suction surface 11a of the suction tool 11, and the movement for the relative movement to the base member 2, which is the other object to be bonded, and the ultrasonic vibrations, applied from or via the suction tool 11, are transmitted without escape nor dislocation.

Figure 3A:
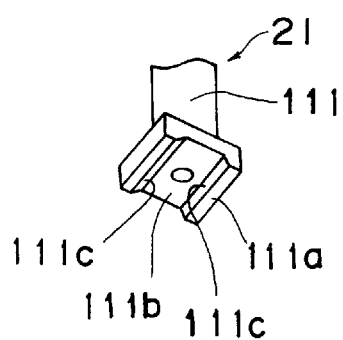
FIG. 3A is a perspective view showing a part of a final friction bonding special tool as a modification example of the holding tool of the friction bonding apparatus of FIG. 1.
Figure 3B:
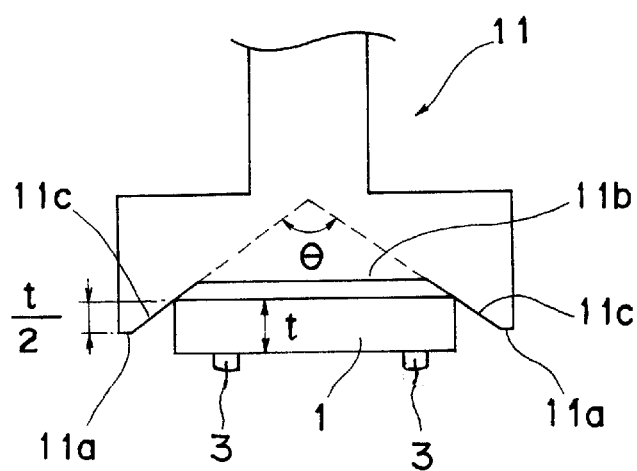
FIG. 3B is a side view of the final friction bonding special tool of FIG. 3A.

It is to be noted that the present invention is not limited to the suction and holding when the object to be bonded, such as the semiconductor element 1, is held for the ultrasonic bonding. For example, as shown in FIG. 3A and FIG. 3B, the semiconductor element 1 is received and held by a pair of taper surfaces 111c formed in correspondence with the opposed two sides of a quadrangle roughly similar to the external form of the semiconductor element 1, which is the object to be held and bonded, in a recess 111b formed on a holding surface 111a of a final friction bonding special tool 111, which serves as another example of the holding tool. With this arrangement, when the semiconductor element 1, which is the object to be bonded, is held by the holding surface 111a of the final friction bonding special tool 111, the semiconductor element 1 is received by the pair of opposed taper surfaces 111c of the recess 111b located at the holding surface 111a, with the pair of opposed corner portions of the semiconductor element 1 brought in tight contact with the taper surfaces 111c, and the movement for the relative movement to the base member 2, which is the other object to be bonded, and the ultrasonic vibrations, applied from or via the final friction bonding special tool 111, are transmitted without escape nor dislocation. According to one example, the angle θ of inclination of the taper surface 111c is preferably 90° to 120°. With regard to the material, when the semiconductor element is made of, for example, Si or sapphire (in the case of LED), the taper surface is preferably made of a hard alloy (cemented carbide), diamond, or the like in order to prevent the abrasion of the tool. About a half of the thickness t of the semiconductor element 1 preferably enter the recess 111b.

With this arrangement, the friction bonding of the metals of the metallic bumps 3 and the wiring lines 4 or the like as described above can efficiently be achieved. The back surface 1b of the semiconductor element 1, which is the object to be bonded sucked by the suction tool 11, does not float from the suction surface 11a and then is not dislocated, and accordingly, there is no frictional contact between them. This enables the prevention of the occurrence of scratches due to the frictional contact between the back surface 1b of the semiconductor element 1 with the suction surface 11a; the adhesion and deposition, onto the suction surface 11a, of particles of silicon powders and chippings generated when the back surface 1b of the semiconductor element 1 suffers scratches, scratches due to the adhesion and deposition possibly caused the back surface 1b of the semiconductor element 1 to be sucked and held; and the abrasion, chipping, and cracking of the element inclusive of the electrodes 1a due to the adhesion and deposition, dissimilar to the conventional case. This enables the improvement of the yield and the prevention of the reduction in quality due to the scratches on the back surface 1b. Moreover, it is also enabled to prevent the occurrence of an issue such that the foreign materials (particles) generated between the back surface 1b of the semiconductor element 1 and the suction surface 11a adhere to the metallic dots 4a and the wiring lines 4 on the base member 2 to impair the read characteristics, and the yield in manufacturing the suspension head 5 is improved.

Indeed, the suction and holding or the holding without suction of the object to be bonded, such as the semiconductor element 1, by the taper surface 11c as described above is required to be effected only in the direction in which the object to be bonded is moved for the aforementioned relative movement or vibrated, and it is sufficient to provide a pair of taper surfaces 11c opposed in the direction of movement. Therefore, either one of the forms shown in FIG. 2C and FIG. 3A is acceptable. However, in the case of FIG. 2C, it is required not to impair the suction and holding of the semiconductor element 1 or the like. In the case of the final friction bonding special tool 111 shown in FIG. 3A, no suction is effected, and accordingly, there is no need for providing a device specially for suppressing air leakage during suction within a range of tolerance. In the case of FIG. 2C, when a suction tool that has only a pair of opposed taper surfaces as shown in FIG. 3A is used, it is required to provide a device specially for suppressing the air leakage during suction within the range of tolerance in order not to impair the suction and holding of the semiconductor element 1 or the like.

In order to achieve the friction bonding as described above, the friction bonding apparatus of the first embodiment is provided with two bonding object handling units 21 and 22 as shown in FIG. 1 through FIG. 3B for holding a pair of objects to be bonded to each other, such as the semiconductor element 1 and the base member 2, and positioning them as shown in FIG. 2B so that their metallic bonding portions, such as the metallic bumps 3 and the wiring lines 4, face each other and a relative movement unit 23 for bringing the metallic bonding portions, which are the metallic bumps 3 and the wiring lines 4, into frictional contact with each other by relatively moving the objects to be bonded to each other, which are the semiconductor element 1 and the base member 2 held by these bonding object handling units 21 and 22, relative to each other, the units being provided on one machine body 25. There is further provided a control unit 24 for controlling the holding and positioning of the objects to be bonded to each other by the bonding object handling units 21 and 22 and the relative movement between the bonding object handling units 21 and 22 by the relative movement unit 23 so as to make the metallic bonding portions of the objects to be bonded to each other held by the bonding object handling units 21 and 22 face each other and perform metallic bonding by bringing them into frictional contact with each other by relative movement. The control unit 24 is made to temporarily partway reduce or stop the friction bonding operation, so that the friction bonding partway reduced or stopped as described above is automatically reliably achieved.

The relative movement unit 23 is required to move a part that belongs to one of the bonding object handling units 21 and 22 and is holding the bonding object and relatively move the one relative to the other as described above, and it is preferable to perform the movement of one of the bonding object handling units 21 and 22 by the relative movement unit 23 by ultrasonic vibrations as described above.

Figure 12:
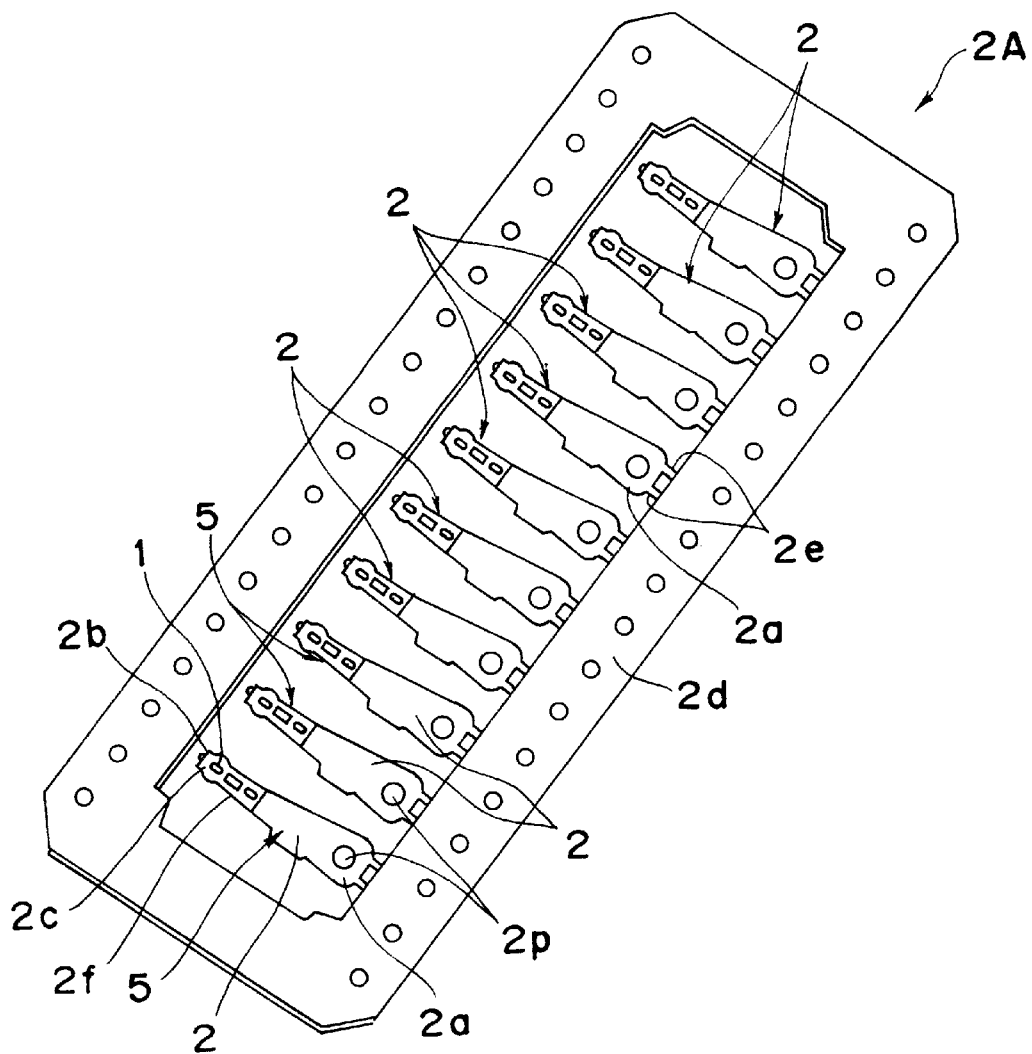
FIG. 12 is a perspective view of a base member assembly showing a relation example between the base member of FIG. 11 and a frame portion that enables the handling of a plurality of base members in the block in the first embodiment.

Accordingly, in the first embodiment, as shown in FIG. 12, a plurality of strip-shaped elongated base members 2 are arranged parallel to one another at regular intervals with only the base portions 2a at one ends connected to the roughly quadrilateral frame-shaped frame portion 2d via connecting portions 2e and with the other end served as free ends. The base member has a number of portions to which the semiconductor element 1 is to be bonded, and the many base members 2 are integrally handled as a base member assembly 2A. Then, in correspondence with the number of base members 2 inside one frame portion 2d of the base member assembly 2A subjected a plurality of times to metallic bonding to the semiconductor elements 1, the bonding object handling unit 22 for handling one base member assembly 2A is made to handle the base member assembly 2A by holding and guiding one frame portion 2d common to the plurality of base members 2 in the base member assembly 2A, and position the frame portion 2d of the base member assembly 2A in a specified bonding position so as to subject one frame portion 2d of the base member assembly 2A to the bonding to the semiconductor elements 1 by a frequency corresponding to the number of the base members 2 with regard to one frame portion 2d of the base member assembly 2A. The units are simply handled by sucking and holding the object to be bonded by means of the suction tool 11 on the bonding object handling unit 21 side, where the semiconductor elements 1 are handled one by one every time of friction bonding. The semiconductor element 1 sucked and held is conveyed into a semiconductor element bonding position of each base member 2 located at the frame portion 2d of the base member assembly 2A positioned by the bonding object handling unit 22, and the metallic bumps 3 and the wiring lines 4 are positioned in the position where they oppose each other, as shown in FIG. 2A. Then, ultrasonic vibrations for the relative movement are applied to the suction tool 11, and the semiconductor element 1 is pressurized against the base member 2 as the need arises. The pressurization promotes the friction bonding by the relative movement of the metallic bonding portions of the metallic bumps 3 and the wiring lines 4 or the like, operating to make the bonding fast and reliable.

According to the friction bonding apparatus of the first embodiment as described above, there can be constituted a frictional bonding apparatus provided with a supply unit for supplying at least one of the pair of objects to be bonded to each other, such as the semiconductor element 1 and the base member 2, to the bonding object handling unit that handles the object. The friction bonding apparatus of the first embodiment shown in FIG. 1 and FIG. 2A through FIG. 2C has a component supply section 31 for automatically supplying the semiconductor element 1 to the bonding object handling unit 21. According to circumstances, the apparatus is provided with a component supply section 32 for automatically supplying the frame portion 2d of the base member assembly 2A provided with the base members 2 to the bonding object handling unit 22 and further with a product storage section 33 for automatically storing the frame portion 2d that has the suspension head 5, as shown in FIG. 12, in which the semiconductor elements 1 are bonded to the base members 2 of the base member assembly 2A, for the facilitation of transfer to another place.

The thus-constructed friction bonding apparatus can successively repetitively perform the aforementioned characteristic friction bonding operation between the object to be bonded, such as the semiconductor element 1, on the side that many objects are individually handled and the other object to be bonded, such as the base member 2, automatically supplied, supplied manually from at least the component supply section 31 every time at need, or automatically from the component supply section 32 every time at need. The manufacturing of a variety of secondary and final products can be achieved automatically, easily, and reliably at high speed by mounting one object to be bonded on the other so that the objects to be bonded to each other are frictionally bonded to each other in a one-to-one correspondence or one-to-plural correspondence. Furthermore, if the product storage section 33 is provided, then it is enabled to automatically successively store the products into a storage cassette 34 or the like in the product storage section 33 even when the products are successively manufactured at high speed, and to handle the products in batches of the number required, facilitating conveyance to another place or subsequent use.

Figure 5A:
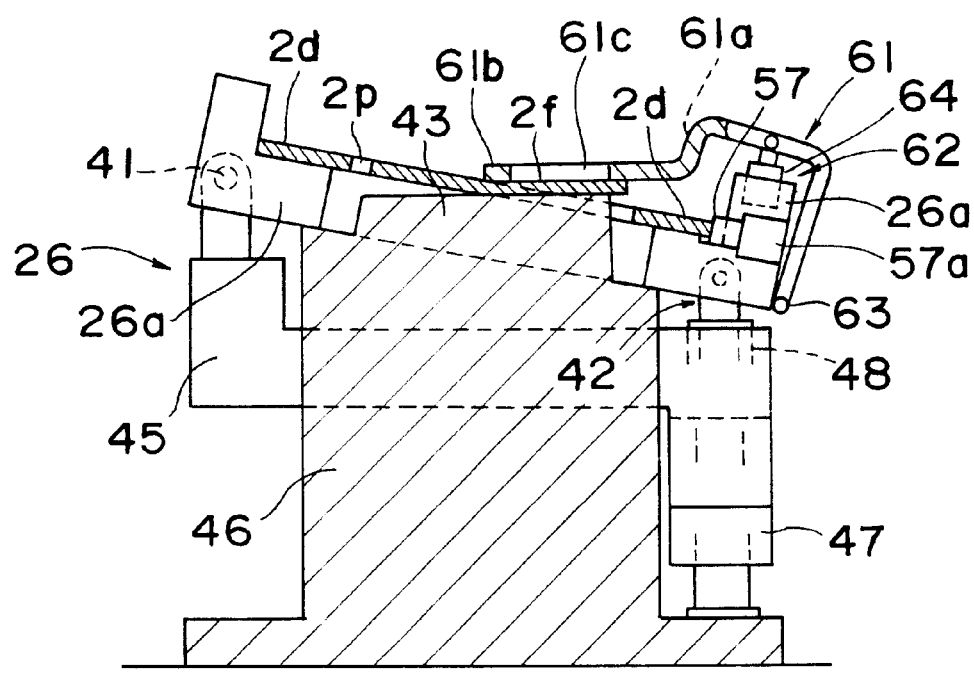
FIG. 5A is a sectional view showing the positioning section of the bonding object handling unit, for the base member of the friction bonding apparatus of FIG. 1.
Figure 6:
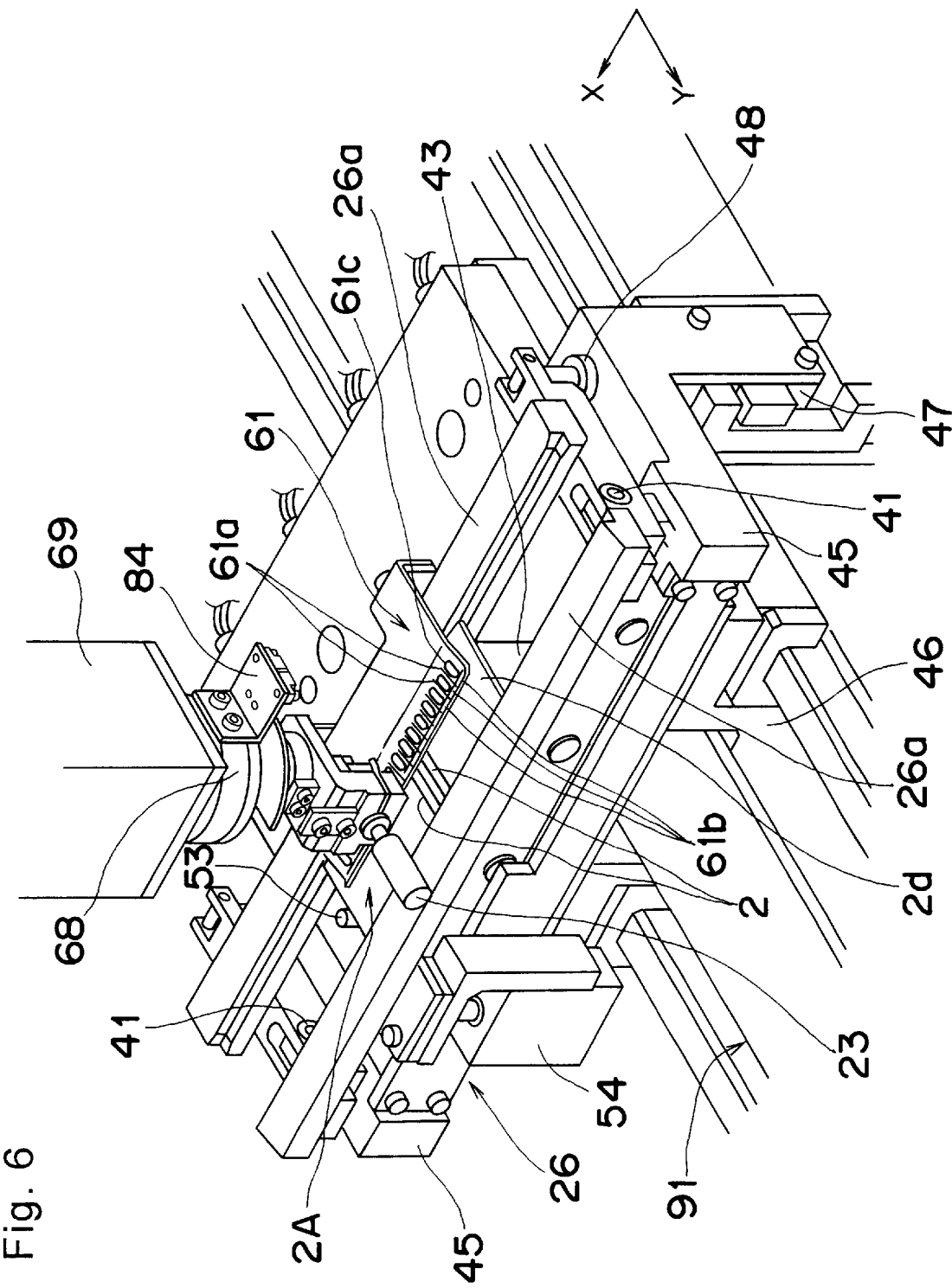
FIG. 6 is a perspective view of the positioning section of FIG. 5A.

The bonding object handling unit 22 located on the side that the movement for the relative movement is not performed is provided with a positioning unit that has a positioning section 26 for loading the frame portion 2d of the base member assembly 2A provided with a plurality of base members 2, holding this, positioning the same in the bonding position for friction bonding, and unloading the frame after the friction bonding. FIG. 5A and FIG. 6 show schematic views of the positioning section 26, and FIG. 16 through FIG. 21 show the detail. With this construction, if the frame portion 2d of the base member assembly 2A that has a plurality of friction bonding portions to be bonded to the semiconductor element 1, which is the other object to be bonded, is positioned one time in the bonding position by the positioning section 26, then it is sufficient to perform the friction bonding on the common positional criterion in each friction bonding position of the object to be bonded positioned as described above when repeatedly handling the other object to be bonded, such as the semiconductor element 1, by means of the bonding object handling unit 21 corresponding to it. The handling of the object to be bonded, such as the base member assembly 2A that has a plurality of portions to be frictionally bonded to the other object to be bonded, such as the base member 2, and the bonding object handling unit 22 for this handling specially require neither a movement for the relative movement nor the movement of conveying the object to be handled and bonded, and the structure becomes simpler by that much.

In the friction bonding apparatus of the first embodiment, with regard to the object to be bonded of each base member 2 of the base member assembly 2A that has the aforementioned frame portion 2d and the metallic bonding portions such as the wiring lines 4 in an inclined portion 2f that extends from this frame portion 2d inwardly of the frame portion 2d as shown in FIG. 12 and is inclined with respect to the frame portion 2d as shown in FIG. 5A, the positioning section 26 is mounted on a positioning unit of characteristics as follows so that the bonding object handling unit 22 provided with the positioning section 26 holds, guides, and handles the frame portion 2d and subjects the metallic bonding portions located in the inclined portion 2f to frictional bonding.

Figure 16:
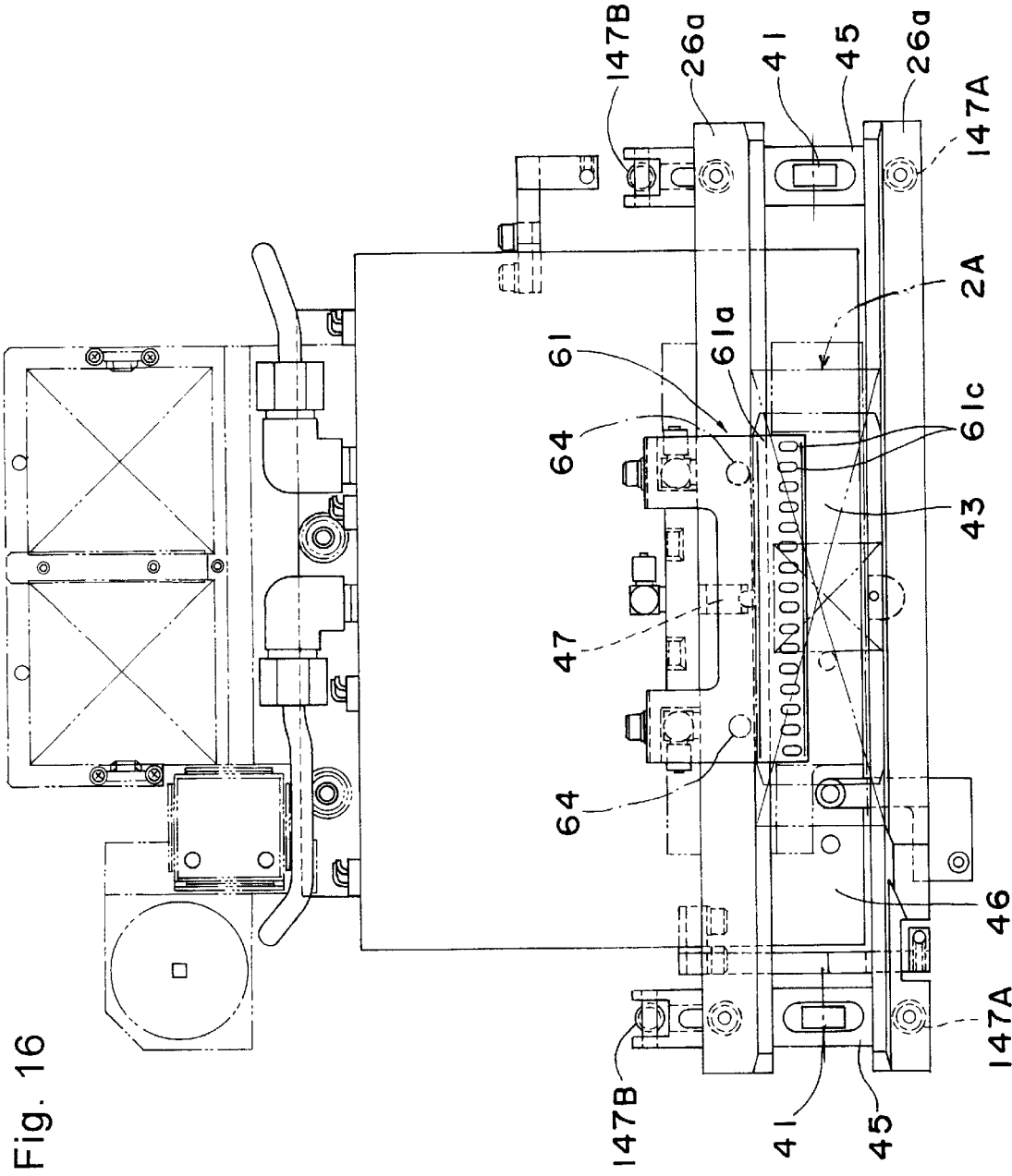
FIG. 16 is a detailed plan view of the positioning section of FIG. 5A.
Figure 17:
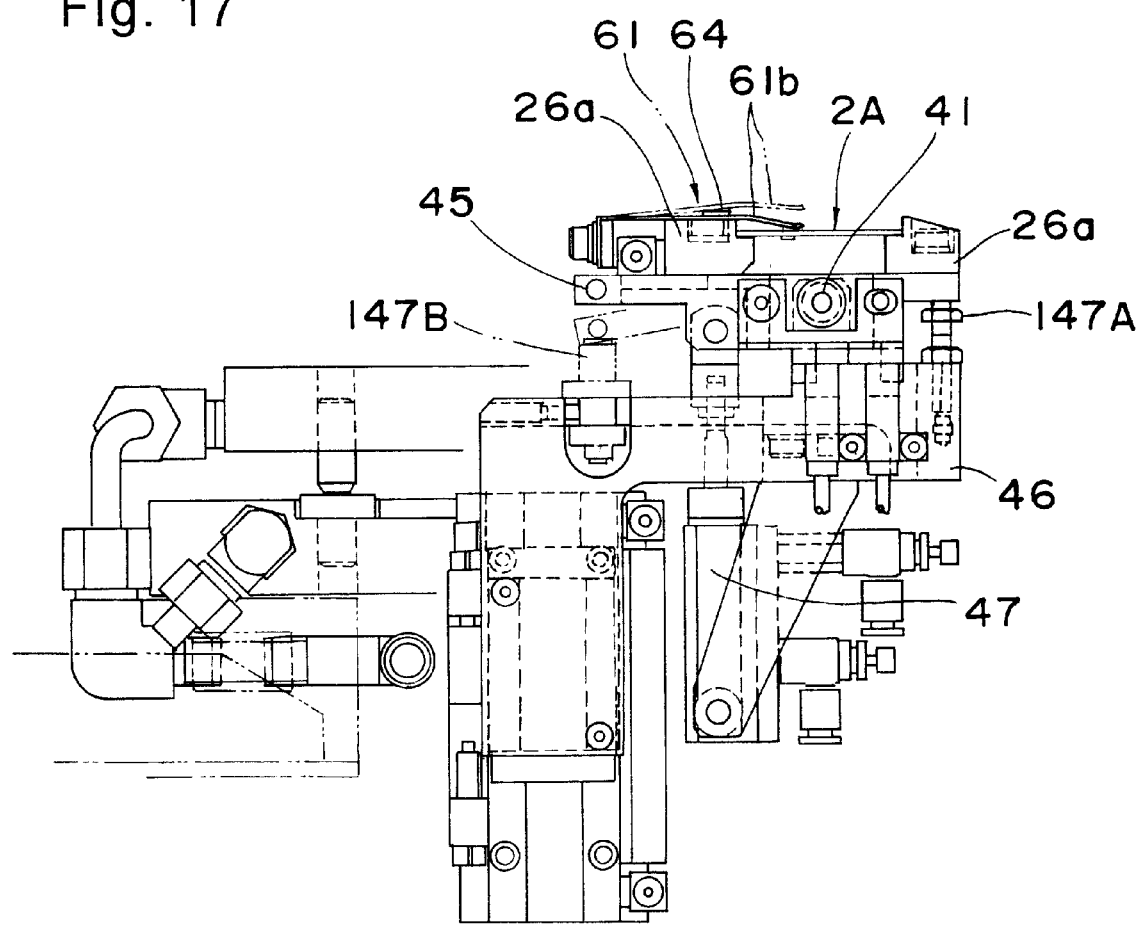
FIG. 17 is a detailed left-hand side view of the positioning section of FIG. 5A.
Figure 18:
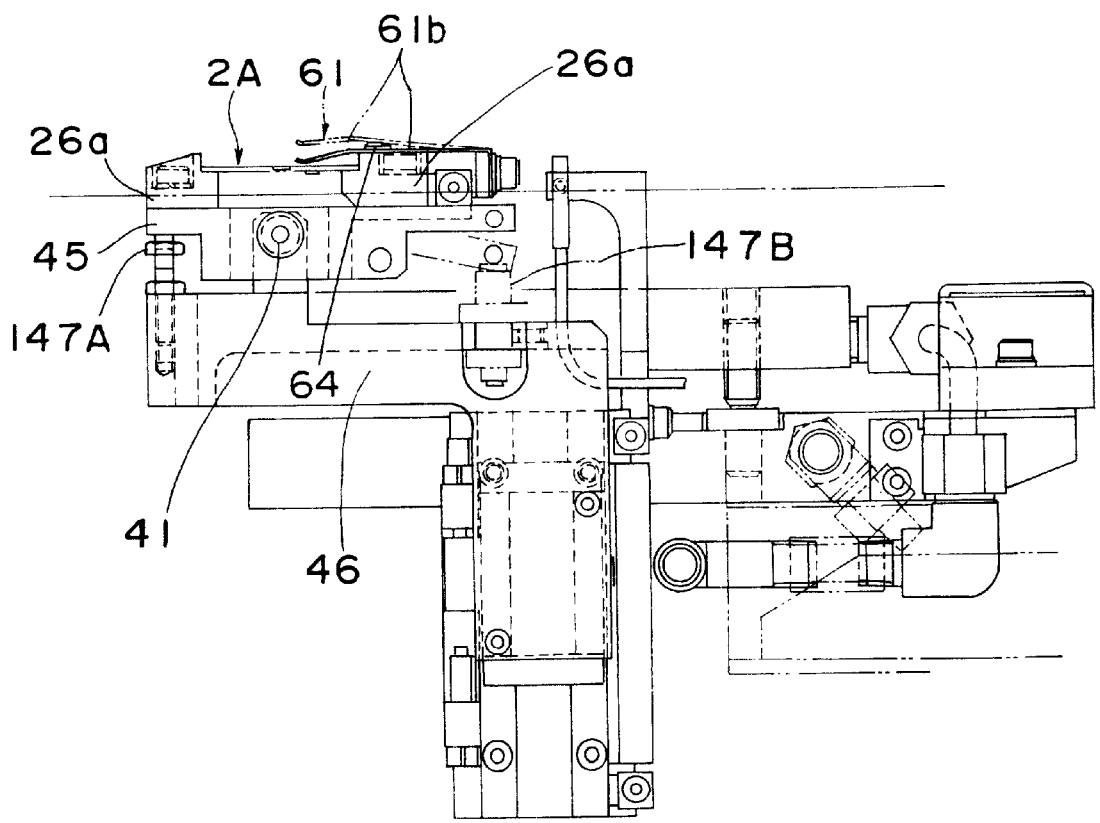
FIG. 18 is a detailed right-hand side view of the positioning section of FIG. 5A.
Figure 19:
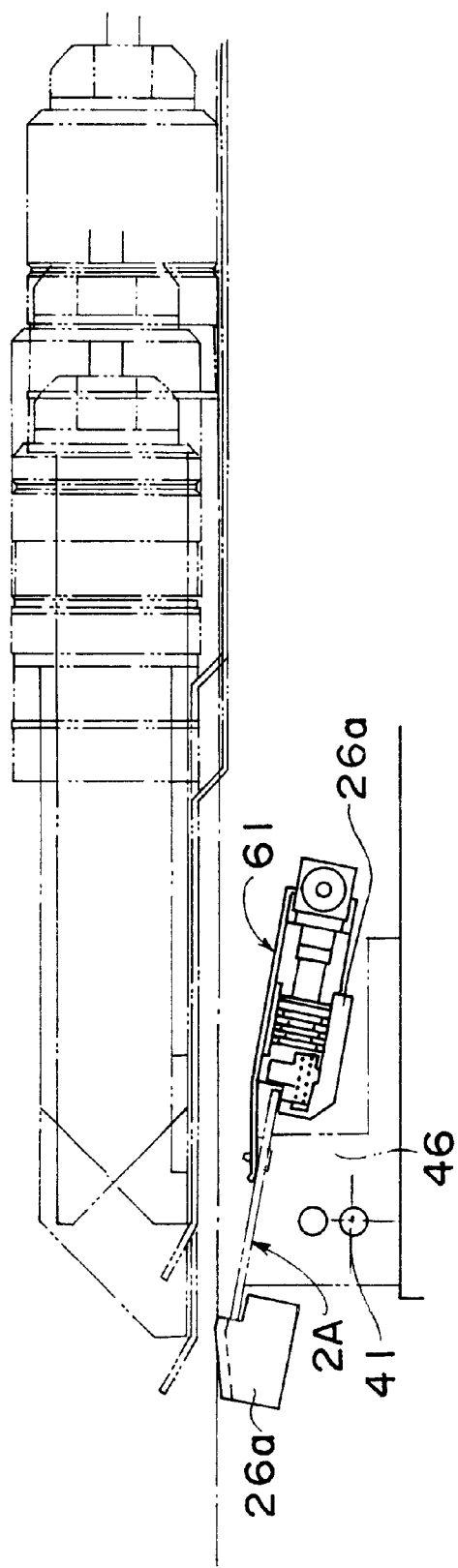
FIG. 19 is a partially enlarged detailed view of the positioning section of FIG. 5A in the bonding position.
Figure 20:
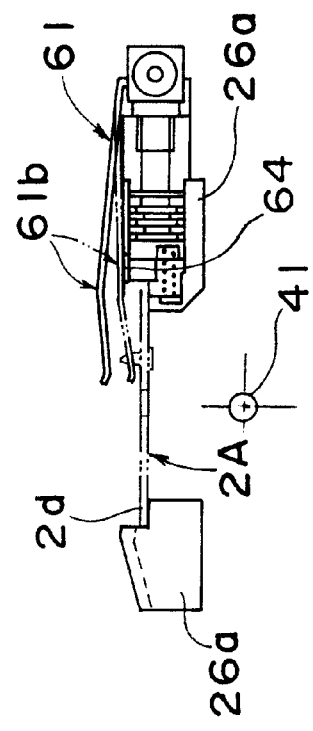
FIG. 20 is a partially enlarged detailed view of the positioning section of FIG. 5A in the unloading/loading position, where the holding position of the pressurizing member is imaginarily indicated by two-dot chain lines.
Figure 21:
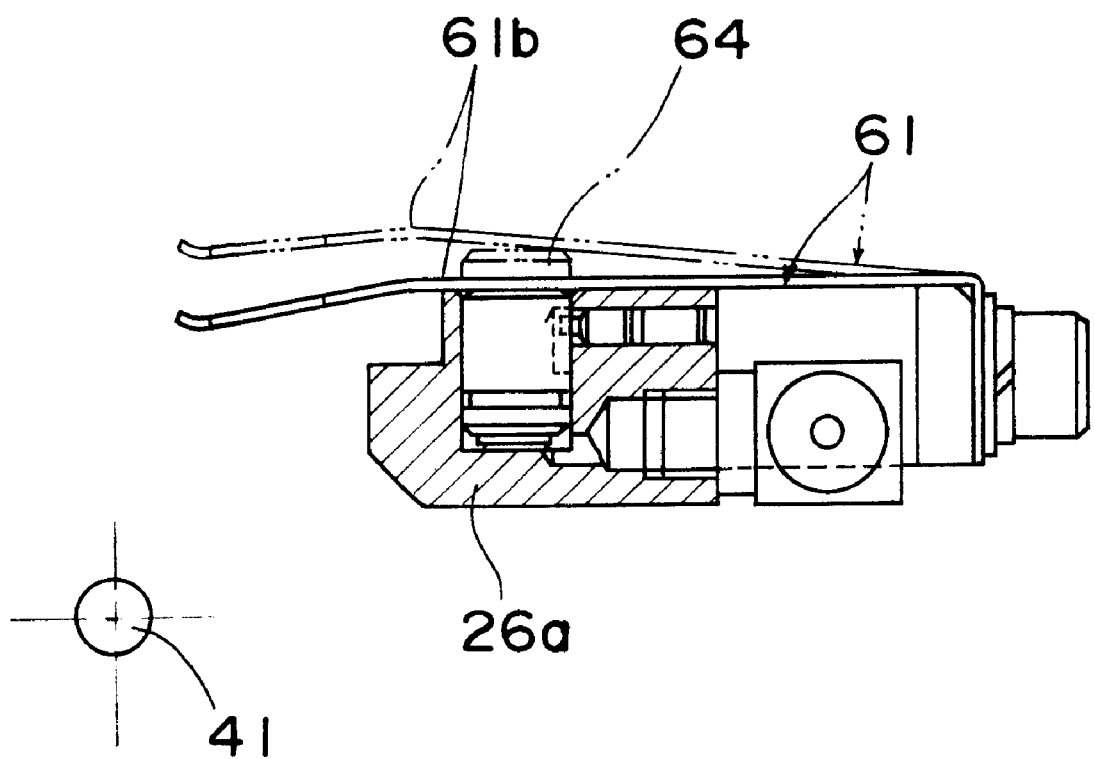
FIG. 21 is a partially enlarged detailed view of the positioning section of FIG. 5A, where the holding position of the pressurizing member is imaginarily indicated by solid lines.

In concrete, the positioning section 26 can move between the unloading/loading position indicated by the solid line in FIG. 20 and the bonding position shown in FIG. 5A and FIG. 19. In the unloading/loading position, as shown in FIG. 6 and FIG. 16, the frame portion 2d of the base member assembly 2A is held and guided along the base member conveyance surface, for example, horizontally, for the loading and unloading of the base member assembly 2A, which serves as the object to be bonded, with respect to the bonding object handling unit 22. In the above-mentioned bonding position, the frame portion 2d is inclined so that the inclined portion 2f of each base member 2 of the frame portion 2d of the base member assembly 2A held and positioned by the positioning section 26 extends along the base member conveyance surface, and positioned and held so as to subject the metallic bonding portions of the wiring lines 4 owned by each inclined portion 2f to metallic bonding. In the illustrated first embodiment, the positioning section 26 is constructed so as to be able to move between the unloading/loading position and the bonding position by pivoting around a shaft 41. In addition to this positioning section 26, the positioning unit is provided with a position switching unit 42 for switching the positioning section 26 between the unloading/loading position along the base member conveyance surface of FIG. 4A and the inclined bonding position of FIG. 5A and a backup section 43 for backing up the frame portion 2d positioned by the positioning section 26 and the inclined portion 2f of the base member 2 when the positioning section 26 is switched to the bonding position. The control unit 24 for controlling the operation in the friction bonding apparatus makes the position switching unit 42 properly operate according to the loading, unloading, positioning, and bonding operations of the base member assembly 2A.

In the illustrated first embodiment, a support base 45, which supports the position switching unit 42 on the shaft 41, is supported so as to be moved up and down by an elevation-use air cylinder 47 with respect to a base 46 of the positioning unit that has the backup section 43 at its upper portion, and the position switching unit 42 is constructed of an air cylinder 48 operated between the support base 45 and the free end portion of the positioning section 26. This air cylinder 48 switches the positioning section 26 into the unloading/loading position and the bonding position at need by being extended and contracted by the operation control of the control unit 24. As indicated by the solid lines in FIG. 17 and FIG. 18, the positioning section 26 is positioned while bringing both ends in the lengthwise direction of the lower end surface of one guide rail 26a into contact with a pair of stoppers 147A in the unloading/loading position. As indicated by the two-dot chain lines in FIG. 17 and FIG. 18, the positioning section 26 is positioned while bringing both ends in the lengthwise direction of the lower end surface of the other guide rail 26a into contact with a pair of stoppers 147B in the unloading/loading position.

It is acceptable to provide a backup state in which the inclined portion 2f of the base member 2 is promptly received by the backup section 43 by the movement of the positioning section 26 into the bonding position, or in other words, a state in which the lower surface of the inclined portion 2f is supported while being brought in contact with the upper surface of the backup section 43. However, in order to more smoothly perform the backup without stress and accordingly without less damage inflicted on the base member 2 and the frame portion 2d, when the positioning section 26 is switched to the bonding position in which the positioning section 26 is inclined, the positioning section 26 located in the bonding position is moved parallel downward by the contraction control of the elevation-use air cylinder 47 from the control unit 24, so that the inclined portion 2f is moved parallel toward the backup section 43 side without shock utilizing the cushioning property of the air cylinder 47, and the inclined portion 2f is reliably seated without stress on the backup section 43. The mechanism for the parallel movement and the movement system of the position switching unit 42 and the positioning section 26 can be constructed through modification in a variety of ways. However, the parallel movement of the positioning section 26 can be eliminated.

According to the positional switching of the positioning section 26 as described above, when the whole body obtained by integrating a plurality of base members 2 with the frame portion 2d is collectively handled by the frame portion 2d, which is sufficiently larger than one base member 2 that becomes the object to be bonded and successively subjected to the friction bonding to the other object to be bonded, such as a plurality of semiconductor elements 1, the positioning section 26 holds and guides the frame portion 2d provided with the base members 2. By this operation, while performing the loading, unloading, and positioning similarly to the case of handling general plate-shaped object such as a circuit board still in the unloading/loading position extended along the board conveyance surface of FIG. 6, the inclined portion 2f, which belongs to the base member 2 that is the object to be bonded positioned via the frame portion 2d by being moved into the specified bonding position of FIG. 5A by the control unit 24 and the position switching unit 42 in the positioned state and is inclined with respect to the frame portion 2d, can be positioned again so as to be backed up by the backup section 43 in a posture along the board conveyance surface as shown in FIG. 5A.

By this operation, the inclined portion 2f of the base member 2 as described above can be subjected to the friction bonding to the other object to be bonded, such as the semiconductor element 1, the required number of times by the bonding object handling unit 21 that handles the object without difficulty, similarly to the case of the general plate-shaped object positioned along the board conveyance surface. Even when the inclined portion 2f and the base member 2 that has the portion 2f are the spring leaves that tend to suffer vibrations and deformation, sufficient friction bonding can reliably be achieved without inflicting damage such as the deformation and injury on them.

In the apparatus of the first embodiment in which the positioning section 26 is moved parallel downward to seat the inclined portion 2f on the backup section 43 without stress, the positioning section 26 is moved parallel upward by the extension control of the air cylinder 47 by the control unit 24 in the stage in which the friction bonding of each base member 2 of the frame portion 2d ends, and the inclined portion 2f is separated from the backup section 43 without stress and thereafter put back to the unloading/loading position from the bonding position by the air cylinder 48.

When the friction bonding ends, or when the friction bonding ends possibly including the upward movement return if the upward movement return is performed, the positioning section 26 is put back to the unloading/loading position along the board conveyance surface of FIG. 6 by the control unit 24 and the position switching unit 42, by which the unloading of the frame portion 2d that has undergone the friction bonding of the semiconductor elements 1 to the inclined portions 2f of the plurality of base members 2 and the loading of a new frame portion 2d can be performed.

For the unloading and loading, the first embodiment shown in FIG. 1, FIG. 5A, and FIG. 6 is provided with a pair of guide rails 26a, 51a, and 52a for holding and guiding the frame portion 2d so that the rails can convey the frame portion 2d in one direction, or in the X-direction in the illustrated first embodiment, where the positioning section 26 and a loading section 51 and an unloading section 52, which are located on both sides of the positioning section 26 and perform the loading and unloading of the frame portion 2d between these sections and the positioning section 26, are continuously arranged. With this arrangement, the unloading of the frame portion 2d after the friction bonding and the loading of a new frame portion 2d in the positioning section 26 can simply be achieved by the simple conveyance in a linear direction utilizing a chain or a belt (not shown) extended through the unloading section 52 and the loading section 51. The frame portion 2d loaded from the loading section 51 into the positioning section 26 is positioned so as to be subjected to the friction bonding in the unloading/loading position on the positioning section 26 by being received by a stopper 53 shown in FIG. 6, which is owned by the positioning section 26 and temporarily projects into the conveyance path by the air cylinder 54.

Moreover, as shown in FIG. 5A, the positioning section 26 is provided with a stopper 57, which advances on one rail 26a of the positioning section 26 toward the other side to clamp the frame portion 2d of the base member 2 that is the object to be bonded received and positioned in the positioning section 26 between the one and the other as shown in the figure, and retreats to release the clamping. The control unit 24 makes the stopper 57 advance to position and hold the frame portion 2d every time the frame portion 2d is received and positioned in the positioning section 26 and makes the stopper 57 retreat every time the bonding operation ends. The stopper 57 is made to advance and retreat by an air cylinder 57a controlled by the control unit 24, and no concrete method is specified therefor. However, if the air cylinder 57a is employed, then there is the advantage that the aforementioned clamping is performed without stress by virtue of the air cushion without specific consideration, scarcely inflicting damage on the frame portion 2d and so on.

As described above, when the frame portion 2d is loaded into the positioning section 26 and positioned in the specified position, the frame portion 2d can be made immovable by clamping the frame portion 2d in the positioning position by the control unit 24 and the stopper 57. The frame portion 2d is prevented from being dislocated by the movement for the relative movement or the variations of the other object to be bonded such as the semiconductor element 1 to be frictionally bonded to the base member 2 owned by the frame portion 2d, and therefore, the friction bonding can be achieved with higher positional accuracy.

Moreover, coping with the arrangement that the inclined portion 2f of the base member 2 owned by the frame portion 2d is formed at the tip portion 2b of the spring leaf that extends into the frame portion 2d and put in a less stable condition, the positioning unit of the illustrated first embodiment is further provided with a pressurizing member 61 supported by one rail 26a of the positioning section 26 so that the inclined base portion of the inclined portion 2f owned by each base member 2 that is the spring leaf is able to be held between the member 61 and the backup section 43 as indicated by the solid lines in FIG. 5A and to release the holding as indicated by the imaginary lines in FIG. 5A and a switching unit 62 for switching the pressurizing member 61 between a holding position and a holding release position with respect to the rail 26a. Therefore, the pressurizing member 61 is put in the holding position every time the frame portion 2d, i.e., the base member 2 that is the object to be bonded is received in the unloading/loading position and positioned in the bonding position the positioning section 26 under the control of the control unit 24, and put in the holding release position every time the bonding operation ends.

In order not to inflict damage on the base member 2 during holding, the pressurizing member 61 is provided as a plate member that has a resiliency, and is supported on the rail 26a while being able to pivot between the holding position and the holding release position by a hinge pin 63 with its tip portion brought in surface-contact with the inclined portion 2f in an overlapping manner for holding. However, the concrete holding system and holding structure can be appropriately changed. The switching unit 62 is constructed of an air cylinder 64 of which the operation is controlled by the control unit 24. This air cylinder 64 is driven to operate so as to increase and decrease an interval between one rail 26a and the free end of the pressurizing member 61, enabling the holding and the release of the holding of the inclined portion 2f, the base member 2, and so on without stress by utilizing the air cushion property of the air cylinder 64. However, this can be replaced by a variety of operating systems and operating mechanisms.

With the aforementioned arrangement, the pressurizing member 61 has its tip portion consistently urged by the resiliency of the pressurizing member 61 itself in a holding direction in which the tip portion holds the inclined portion 2f in an overlapping manner, and the holding of the inclined portion 2f can be released by pushing up the pressurizing member 61 by the piston rod of the air cylinder 64 by the driving of the air cylinder 64.

Particularly in the illustrated first embodiment, considering the fact that the base member 2 and the inclined portion 2f easily suffer damage and deformation in an initial stage in which the tip portion of the pressurizing member 61 is brought in surface contact with the inclined portion 2f in an overlapping manner so as to hold the portion 2f and in an initial stage in which this holding is released, the control unit 24 executes further control such that the operating speed is gradually increased from a slow-speed state at the start of the holding and the start of the release of the holding of the pressurizing member 61, enabling the holding and the release of the holding to be performed with less damage.

According to the holding operation by the pressurizing member 61, the pressurizing member 61 is put in the holding position by the control unit 24 and the switching unit 62 when the positioning section 26 is subjected to the friction bonding in a state in which the inclined portion 2f of the base member 2 is backed up by the backup section 43 while being extended along the board conveyance surface in the positioning section 26, the inclined portion 2f is held between the pressurizing member 61 and the backup section 43. With this arrangement, the inclined portion 2f located at the tip portion 2b of the base member 2 constructed of the spring leaf can be prevented from vibrating or being dislocated or deformed during the friction bonding, and sufficient friction bonding can be secured without inflicting damage on the base member 2. By locating the pressurizing member 61 in the holding release position after the friction bonding, the unloading of the frame portion 2d from the positioning section after the friction bonding and the loading of a new object to be bonded are not disturbed.

Figure 5B:
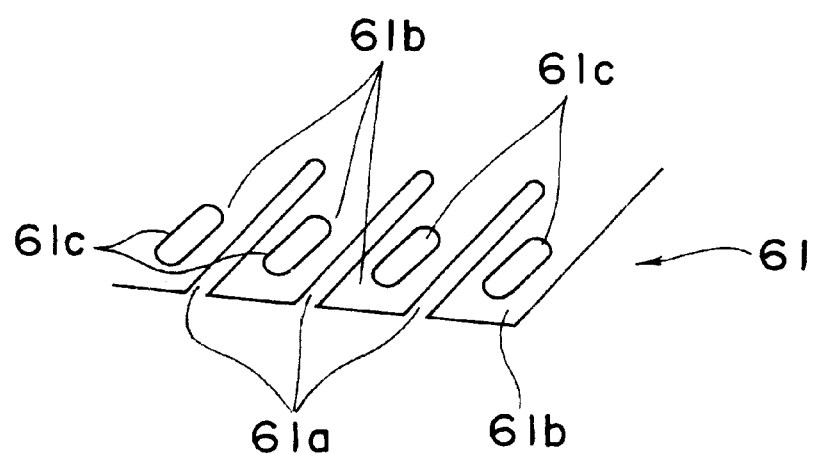
FIG. 5B is a partially enlarged perspective view of the pressurizing leaf of the pressurizing member of the positioning section of FIG. 5A.

Moreover, in the pressurizing member 61, as shown in FIG. 5B, in correspondence with each of the plurality of base members 2, a pressurizing leaf 61b is provided with a penetration window 61c, i.e., a through hole through which the metallic bonding portions of the wiring lines 4 located on the inclined portion 2f of each base member 2 is exposed and subjected to the frictional bonding when the pressurizing leaf 61b independently provided by slits 61a or the like is overlapped for surface contact to perform the holding and the release of the holding.

According to this arrangement, by individually holding the plurality of base members 2 by the independent pressurizing leaves 61b corresponding to the members 2, even if there is a difference in the position and shape between the base members 2 and the pressurizing leaves 61b, it is guaranteed to insert the semiconductor element 1 sucked and held by the suction tool 11 into the through hole 61c through the through hole 61c owned by each pressurizing leaf 61b while holding the members 2 without mutual interference nor stress, bring the respective bumps 3 of the semiconductor element 1 into contact with the wiring lines 4 exposed inside the through hole 61c and perform the friction bonding with the aforementioned high positional accuracy.

According to the construction of the aforementioned friction bonding apparatus, the positioning in the unloading/loading position, the movement to the bonding position, and the holding operation of the base member assembly 2A are operated as follows under the control of the control unit 24. That is, when the base member assembly 2A is loaded from the loading section 51 into the positioning section 26 and the base member assembly 2A, or the frame portion 2d is received into the unloading/loading position in the positioning section 26, then the stopper 53 moves up to position the base member assembly 2A in the unloading/loading position with the tip portion of the base member assembly 2A stopped by the stopper 53 by contact. Thereafter, the stopper 57 is made to advance by the air cylinder 57a, positioning and holding the frame portion 2d with respect to the positioning section 26. Thereafter, the air cylinder 48 is made to contract (retreat its piston) to incline the positioning section 26 as shown in FIG. 5A and FIG. 19 by the pivoting of the positioning section 26 around the shaft 41 from the unloading/loading position to the bonding position. Concurrently, the positioning section 26 located in the bonding position is moved parallel downward by the contracting control of the piston rod of the elevation-use air cylinder 47, i.e., descent control. The inclined portion 2f is moved parallel toward the backup section 43 without shock taking advantage of the cushioning property of the air cylinder 47, and the inclined portion 2f is reliably seated and supported on the backup section 43 without stress as shown in FIG. 5A. Thereafter, the air cylinder 64 is driven to move down the piston rod, concurrently holding the inclined portions 2f of all the base members 2 between the tip of the pressurizing member 61 and the backup section 43 by the resilience force of the pressurizing member 61 as shown in FIG. 5A and FIG. 19. In the state in which the inclined portions 2f of all the base members 2 are held between the pressurizing member 61 and the backup section 43, the semiconductor element 1 sucked and held by the suction tool 11 is inserted into the through hole 61c of each pressurizing leaf 61b of the pressurizing member 61. The respective bumps 3 of the semiconductor element 1 are brought in contact with the wiring lines 4 exposed inside the through hole 61c, and the aforementioned initial friction bonding, reduction or temporary stop, and final friction bonding are performed. When the bonding of the semiconductor element 1 to the base member assembly 2A ends, the air cylinder 64 is driven to move up the piston rod, concurrently releasing the holding of the inclined portions 2f of all the base members 2 between the tip of the pressurizing member 61 and the backup section 43 by the resilience force of the pressurizing member 61. Next, the elevation-use air cylinder 47 is moved up in a manner that its piston rod moves upward to extend to move parallel upward the positioning section 26 located in the bonding position, and the piston rod of the air cylinder 48 is extended to put the positioning section 26 back into the unloading/loading position from the bonding position by the pivoting around the shaft 41. Subsequently, the stopper 57 is made to retreat by the air cylinder 57a so as to release the positioning and holding of the frame portion 2d with respect to the positioning section 26, and the stopper 53 is moved down to release the stop by contact by the stopper 53. Next, the base member assembly 2A that has undergone the bonding work is unloaded from the unloading/loading position by the unloading section 52, and the next new base member assembly 2A is loaded into the unloading/loading position and subjected to the bonding work, similarly to the foregoing case.

The friction bonding apparatus of the first embodiment has a movement unit 65 for repetitively performing the positioning of the suction tool 11 in the pickup, conveyance, and friction bonding positions of the semiconductor element 1 when the bonding object handling unit 21 located on the side that the movement for the relative movement is performed sucks and holds the object to be bonded such as the semiconductor element 1 supplied from the component supply section 31 by means of the suction tool 11 as described above to pick up and convey the object, and brings the object in frictional contact with the other object to be bonded such as the base member 2 held and positioned by the bonding object handling unit 22 that does not perform the movement for the relative movement with their metallic bonding portions such as the metallic bumps and the wiring lines 4 facing each other for the execution of friction bonding.

The movement unit 65 has a transverse movement mechanism 66 for moving the suction tool 11 within the required range on a plane as shown in FIG. 1 and a vertical movement mechanism 67 for vertically moving the tool on this transverse movement mechanism 66. However, the present invention is not limited to this, and a variety of other movement mechanisms such as a multiarticular robot whose one arm has a complex movement of those movements can be used.

The suction tool 11 is supported so as to move up and down by a bonding head 68 shown in FIG. 1, FIGS. 2A through FIG. 2C, and FIG. 4A supported to move along the base member conveyance surface into the required position by the transverse movement mechanism 66 as one example via a voice coil motor 69 as one example of the vertical movement mechanism 67 and is able to perform vertical (up-and-down) motions for the pickup and the friction bonding of the semiconductor element 1 and the pressurization during friction bonding. The relative movement unit 23 is, for example, an oscillator that has a piezoelectric element for applying ultrasonic vibrations for causing the relative movement of the suction tool 11 for the friction bonding, and an ultrasonic horn 71 for generating ultrasonic waves is connected to the suction tool 11. This unit ultrasonically vibrates only the necessary-minimum suction tool 11, and therefore, the load is permitted to be small, exerting less influence on the other units. Moreover, the bonding head 68 is provided with a motor 72 for rotatively driving the suction tool 11 and is able to correct or switch the direction of suction of the semiconductor element 1 sucked and held by the suction tool 11.

On the other hand, the component supply section 31 for supplying the semiconductor elements 1 employs a storage cassette 76 in which dicing sheets 74 for subjecting the semiconductor element 1 to a dicing process separating it into individuals and carrying them are stored in a multi-deck style, and a dicing sheet 74 that carries the required semiconductor elements 1 are drawn out of this storage cassette 76 into a component supply position 77 as shown in FIG. 1, and FIG. 2 through FIG. 2C, and the semiconductor element 1 needed each occasion is subjected to the pickup performed by the suction tool 11. For this pickup, a recognition camera 70 for the image recognition of necessary data of the position, posture, quality rank, and so on of the semiconductor element 1 subjected to the pickup is provided in the component supply position 77, enabling the suction tool 11 to pick up the semiconductor element 1 with high accuracy and enabling necessary measures to be taken on the basis of the recognized data of the disposal and so on of a defective semiconductor element 1.

In the illustrated apparatus of the first embodiment, the component supply section 31 is further provided with a bonding object inverting mechanism 101 for sucking and holding the flip-chip type semiconductor element 1 supplied through more efficient handling in the component supply position 77 and subjecting the element 1 supplied to the friction bonding. The bonding object inverting mechanism 101 has, for example, four suction tools 103 (refer to FIG. 3C) for inverting use at intervals of 90° on a rotary member 102 for being rotated by a motor or the like around a horizontal axis 104, and the suction tools 103 pick up the semiconductor elements 1 on the dicing sheet 74 located in the component supply position 77 with the semiconductor elements 1 facing down. As shown in FIG. 2A, while conveying the elements to the pickup position or after conveying the elements to the pickup position as indicated by arrow C in FIG. 2A by the bonding object inverting mechanism 101, the inverting mechanism 101 rotates the rotary member 102 to make the suction tool 103 face up. By this operation, the semiconductor element 1 picked up from the dicing sheet 74 by the bonding object inverting mechanism 101 is vertically inverted, and the semiconductor element 1, which is sucked and held by the suction tool 103 of the bonding object inverting mechanism 101 positioned in the pickup position in the state in which the semiconductor element 1 is inverted, is subjected to the pickup by the suction tool 11. In concrete, the semiconductor element 1 that has been sucked and held by the suction tool 103 is sucked and held by the suction tool 11, and thereafter, the suction by the suction tools 103 is released to deliver the semiconductor element 1 from the suction tools 103 to the suction tool 11. It is to be noted that the reference numeral 103a denotes a suction hole in FIG. 3C. Moreover, the bonding object inverting mechanism 101 is able to advance and retreat in the direction of arrow C in FIG. 2A, i.e., in the X-direction between the dicing sheet 74 and the pickup position in order to perform the aforementioned operation.

In many cases, the semiconductor element 1 is manufactured and handled so that each electrode 1a and each metallic bump 3 face up on the dicing sheet 74. However, if the semiconductor element 1 after being vertically inverted by the bonding object inverting mechanism 101 is subjected to the pickup by the suction tool 11 as described above, then each electrode 1a and each metallic bump 3 of the semiconductor element 1 picked up by the suction tool 11 face down to face the wiring line 4 of the base member 2 held and positioned by the positioning section 26. Therefore, the friction bonding operation can be performed by simply making the metallic bumps 3 and the wiring lines 4 face each other.

Indeed, a variety of other component supply systems and supply mechanisms can be adopted according to the type, such as the shipped posture, of the component to be handled.

As shown in FIG. 1 and FIG. 2A, the positioning section 26 is moved by a Y-direction movement mechanism 91 between a loading/unloading position 78 which is aligned in a line with the loading section 51 for loading the base member assembly 2A and the unloading section 52 for unloading the base member assembly 2A and in which the loading and unloading of the base member assembly 2A having a number of base members 2 are performed in the X-direction and a working position 79 which is moved from the loading/unloading position 78 in the Y-direction perpendicular to the X-direction and in which the friction bonding work is performed; and moved into the working position 79 every time each base member 2 of the frame portion 2d held and positioned is subjected to the friction bonding work. One example of the Y-direction movement mechanism 91 is constructed of: a ball thread that is forwardly and reversely rotated by a motor; and a moving body that is fixed to a nut member meshed with the ball thread and is made to advance and retreat between the loading/unloading position 78 and the working position 79. However, the movement between the loading/unloading position 78 and the working position 79 is not essential. A recognition camera 81 is also provided under a path through which the semiconductor element 1 is conveyed by the suction tool 11 from the component supply position 77 to the working position 79 as shown in FIG. 2A. This enables the image recognition of the suction posture, the angle of rotation, and the position of the semiconductor element 1 conveyed by the suction tool 11, the angle correction due to the rotation of the suction tool 11 around the suction tool axis, the redoing of pickup when the correction cannot be done, and so on. Furthermore, a recognition camera 83 for the image recognition of the position and the state of, in particular, the inclined portion 2f of the base member 2, which is the object to be bonded, i.e., the object to be frictionally bonded when viewed from the suction tool 11 side is provided in a bonding position 82 in which the semiconductor element 1 is bonded to the base member 2 by friction bonding. This enables the positioning of the semiconductor element 1 sucked and held by the suction tool 11 for the friction bonding with high accuracy and the execution of a process for preventing the wasteful bonding of the semiconductor element 1 to a defective base member 2. Moreover, the bonding head 68 is provided with a recognition camera 84 for monitoring the bonding work of the suction tool 11, and this enables the bonding work state to be monitored. The upper surface of the machine body 25 is provided with a monitor 85 for displaying various control modes and control states of the control unit 24 and various supports and guides based on them, and a monitor 86 for displaying the aforementioned bonding state in the form of a video image or the like, for the convenience of the bonding work.

In particular, the friction bonding apparatus of the first embodiment shown in FIG. 1, and FIG. 2 through FIG. 2C is provided with two bonding object handling units 21 and in particular, necessary-minimum two bonding heads 68 on the side that the movement for the relative movement is performed, and the bonding heads 68 can be moved linearly reciprocally in the X-direction individually by ball threads 66a and 66b (refer to FIG. 1 and FIG. 4A) that are driven to forwardly and reversely rotate by a motor in the horizontal (lateral) movement mechanism 66.

With this arrangement, the two bonding heads 68 can be properly used by setting specifications corresponding to each application to the initial friction bonding (the so-called temporary bonding) and the final friction bonding (the so-called primary bonding) with interposition of the reduction or stop of the friction bonding. By the proper use as described above, the stop condition of the friction bonding between the initial friction bonding and the final friction bonding can also be satisfied by switching the bonding head 68 to be used for the initial friction bonding and the final friction bonding while stably achieving the two types of friction bonding operations of different conditions of the initial friction bonding and the final friction bonding without executing complicated and delicate control.

In this case, although the rate of reduction and so on cannot be strictly specified, temporary fixation is only required for the initial friction bonding. Accordingly, this means a state in which the positioning is completed with all the metallic bumps 3 of the semiconductor element 1 bonded to the wiring lines 4 of the base member 2 that is the object to be bonded, or in other words, a state in which all the bumps 3 are regulated in height to a certain extent. As a concrete example, the initial friction bonding is performed with an ultrasonic output of 0.5 W for 0.1 seconds, and the final friction bonding is performed with an ultrasonic output of 1.0 W for 0.3 seconds. That is, the reduction is effected with an output of not higher than 0.6 (W) of the final friction bonding and not lower than 0.2 (W) necessary for obtaining a certain degree of bonding strength or more preferably effected with an output within a range of 0.3 to 0.5 (W) The time is permitted to be shorter than 0.1 seconds.

For the above-mentioned use in the first embodiment shown in FIG. 1, and FIG. 2 through FIG. 2C, the suction tool 11 of one bonding head 68 repeats the execution of the initial friction bonding by sucking and holding the semiconductor element 1 supplied into the pickup position by the bonding object inverting mechanism 101 and then conveying the element 1 onto the base member 2, as indicated by arrow A in FIG. 2A. The suction tool 11 of the other bonding head 68 repeats the execution of the final friction bonding by sucking and holding the semiconductor element 1 on the base member 2 in a state in which the one bonding head 68 has been moved away after the end of the initial friction bonding while the one bonding head 68 finishes the initial frictional bonding, departs for the suction and holding of the next semiconductor element 1 and returns, as indicated by arrow B in FIG. 2A.

Figure 3C:
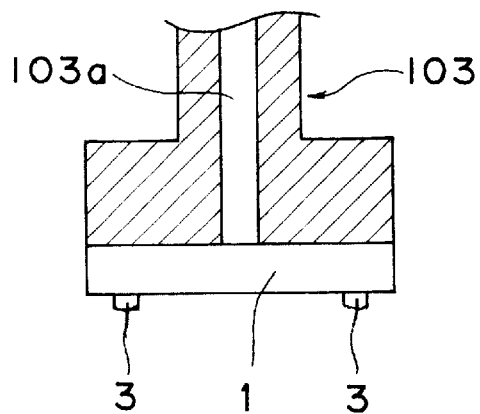
FIG. 3C is a sectional view of a suction tool for inverting use.

The holding tool of the other bonding head 68 is not limited to the above-mentioned suction tool 11. For example, it is not required to specially suck and hold the semiconductor element 1 for the purpose of performing the final friction bonding of the temporarily bonded semiconductor element 1 after the end of the initial friction bonding by the one bonding head 68, and it is only required to relatively move the semiconductor element 1 relative to the base member 2 or, in concrete, to apply ultrasonic vibrations. The final friction bonding special tool 111 of FIG. 3A and FIG. 3B is also acceptable. Moreover, when the holding tool of the other bonding head 68 is provided by the final frictional bonding special tool 111 as described above, the suction tool 11 of the one bonding head 68 is not limited to the one that has a recess 1ib and a taper surface 11c as described above, and a suction tool similar to the inversion-use suction tool 103 whose suction surface is a mere flat surface shown in FIG. 3C is also acceptable, as described above.

Indeed, the pickup, the initial friction bonding, and the final friction bonding of the semiconductor element 1 can be performed only by one of the two bonding heads 68. In this case, when there are the issues of the failure, the damage, and the limitation in durability of the one bonding head 68 itself or the object to be bonded such as the semiconductor element 1 held by the head, the friction bonding operation can normally be continued by the other bonding head 68 while tackling the issues. Therefore, a reduction in the operation rate can be avoided.

The reduction of the friction bonding operation can be performed by the operation control of the control unit 24 and also performed by stopping the relative movement between the metallic bonding portions of the metallic bumps 3 and the wiring lines 4 or the like or stopping the pressurization between the metallic bonding portions. With regard to the stop of pressurization, the influence of pressurization can be set free when performed by separating the suction tool 11 apart from the object to be bonded, such as the semiconductor element 1, sucked and held by the tool. However, the stop state can be obtained only by stopping the progress of pressurization according to circumstances. Otherwise, the reduction of the friction bonding operation can also be achieved by reducing both the relative movement of the objects to be bonded to each other, such as the semiconductor element 1 and the base member 2, and the pressurization between the metallic bonding portions. The stop of the friction bonding operation can be achieved by stopping both the relative movement of the objects to be bonded to each other, such as the semiconductor element 1 and the base member 2, and the pressurization between the metallic bonding portions of the metallic bumps 3 and the wiring lines 4 or the like.

This will be described in concrete.

A relation between pressurization and ultrasonic vibrations will be described first.

Figure 22:
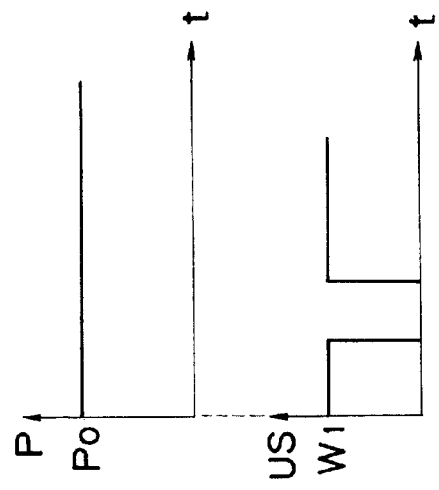
FIG. 22 is a graph showing a relation between a load, an ultrasonic output, and time in a case where the ultrasonic output is reduced with constant pressurization by the friction bonding apparatus and method of the first embodiment.
Figure 23:
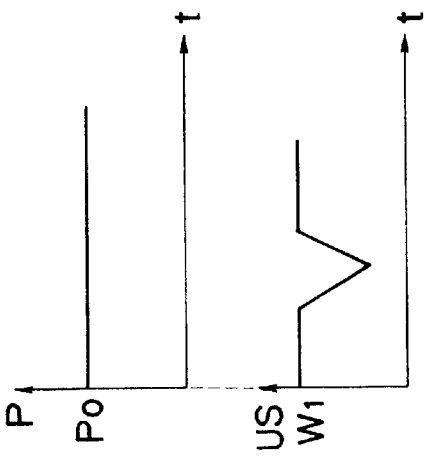
FIG. 23 is a graph showing a relation between a load, an ultrasonic output, and time in a case where the ultrasonic output is stopped with constant pressurization by the friction bonding apparatus and method of the first embodiment.

FIG. 22 is a graph showing a relation between a load P, an ultrasonic output W, and time t in a case where the ultrasonic output W is reduced with the pressurization kept constant at a load $P_0$, according to the friction bonding apparatus and method of the first embodiment. FIG. 23 is a graph showing a relation between the load P, the ultrasonic output W, and the time t in a case where the ultrasonic output W is stopped with the pressurization kept constant at the load $P_0$, according to the friction bonding apparatus and method.

Figure 24:
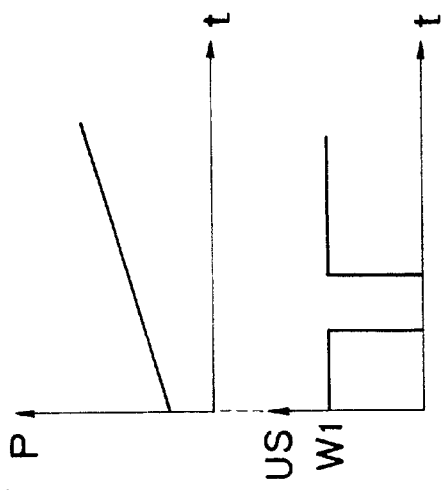
FIG. 24 is a graph showing a relation between a load, an ultrasonic output, and time in a case where the ultrasonic output is reduced with increasing pressurization by the friction bonding apparatus and method of the first embodiment.
Figure 25:
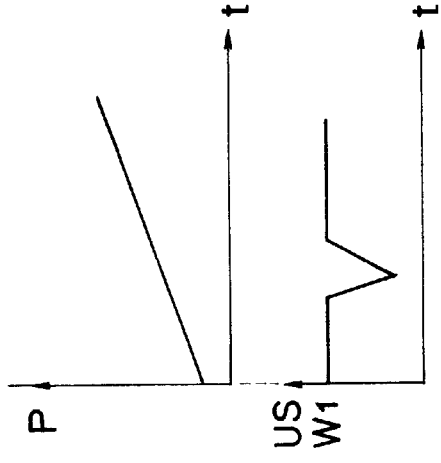
FIG. 25 is a graph showing a relation between a load, an ultrasonic output, and time in a case where the ultrasonic output is stopped with increasing pressurization by the friction bonding apparatus and method of the first embodiment.

FIG. 24 is a graph showing a relation between the load P, the ultrasonic output W, and the time t in a case where the ultrasonic output W is reduced with the pressurization performed constantly, i.e., with the load P increasing at a constant rate, according to the above-mentioned friction bonding apparatus and method. FIG. 25 is a graph showing a relation between the load P, the ultrasonic output W, and the time t in a case where the ultrasonic output W is stopped with the pressurization performed constantly, i.e., with the load P increasing at a constant rate, according to the above-mentioned friction bonding apparatus and method. The bumps 3 tend to more easily associate with the wiring lines (lands) 4 with the improvement of the bonding strength in the case of FIG. 24 and FIG. 25 than in the case of FIG. 22 and FIG. 23.

The control of the temporary bonding and the primary bonding, i.e., the initial friction bonding and the final friction bonding will be described next.

Figure 26:
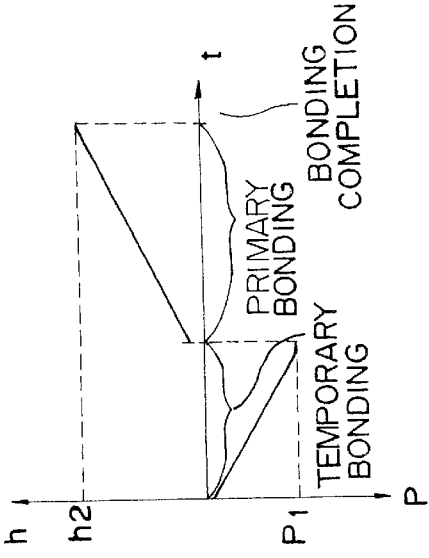
FIG. 26 is a graph showing a relation between height, load, and time in a case where temporary bonding is performed by height control and primary bonding is performed by load control by the friction bonding apparatus and method of the first embodiment.

FIG. 26 is a graph showing a relation between height, load, and time in a case where the temporary bonding is performed by height control and the primary bonding is performed by load control, according to the friction bonding apparatus and method. It is to be noted that the height mentioned here is defined so that, for example, the height of a bonding start position in which the suction surface of the suction tool 11 faces the wiring lines 4 on the wiring lines 4 is 0 and the value of height increases as the suction tool 11 moves down. The temporary bonding is completed when the height becomes $h_1$. When the temporary bonding is completed, the load P effected on the bumps 3 and the wiring lines (lands) 4 via the suction nozzle 11 is controlled by moving further downward the suction tool 11 by means of the voice coil motor 69, and the primary bonding is completed when the load becomes $P_2$.

Figure 27:
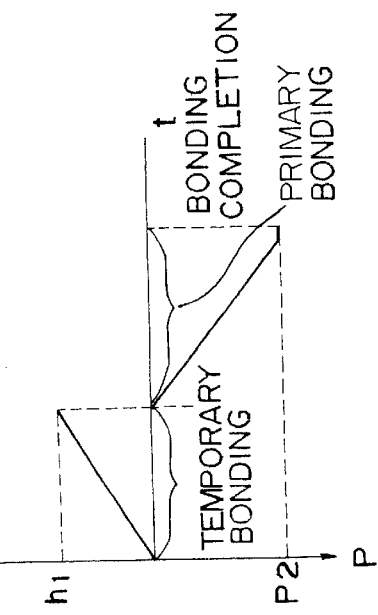
FIG. 27 is a graph showing a relation between the height, load, and time in a case where the temporary bonding is performed by load control and the primary bonding is performed by height control by the friction bonding apparatus and method of the first embodiment.

On the other hand, conversely, FIG. 27 is a graph showing a relation between height, load, and time in a case where the temporary bonding is performed by load control and the primary bonding is performed by height control. That is, the load P effected on the bumps 3 and the wiring lines (lands) 4 via the suction nozzle 11 is controlled, and the temporary bonding is completed when the load becomes $P_1$. The suction nozzle 11 is moved further downward by the voice coil motor 69 when the temporary bonding is completed, and the primary bonding is completed when the height becomes $h_2$.

Figure 28:
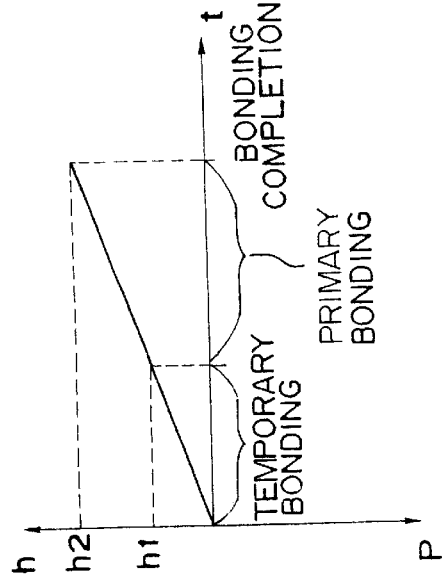
FIG. 28 is a graph showing a relation between height and time in a case where the temporary bonding and the primary bonding are performed by height control by the friction bonding apparatus and method of the first embodiment.
Figure 31:
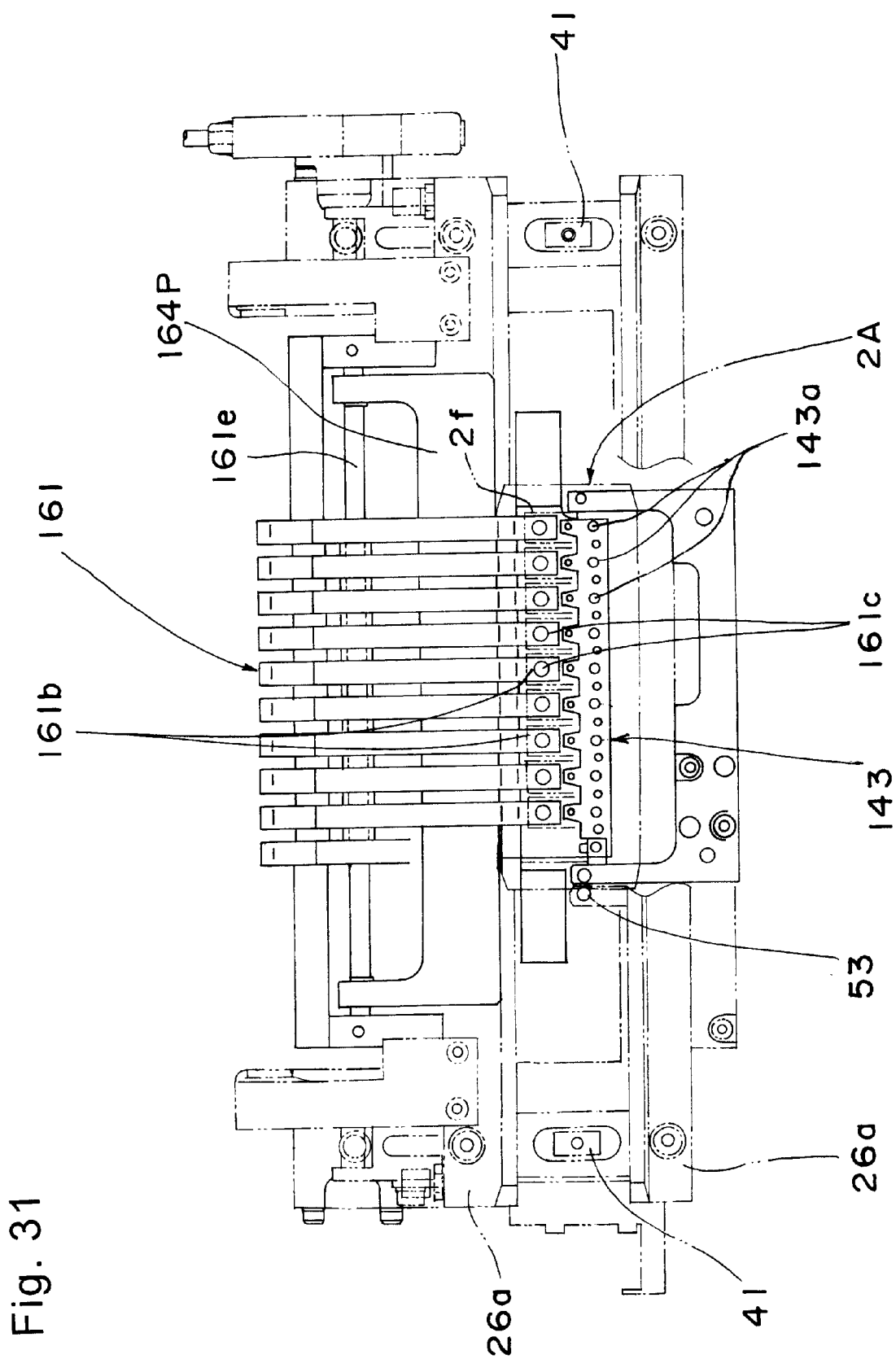
FIG. 31 is a detailed plan view of the positioning section of a friction bonding apparatus according to a third embodiment of the present invention.

FIG. 28 is a graph showing a relation between height, and time in a case where the temporary bonding and the primary bonding are performed by height control, according to the aforementioned friction bonding apparatus and method. That is, the temporary bonding is completed when the height becomes $h_1$. The suction tool 11 is moved further downward by the voice coil motor 69 when the temporary bonding is completed, and the primary bonding is completed when the height becomes $h_2$.

Figure 29:
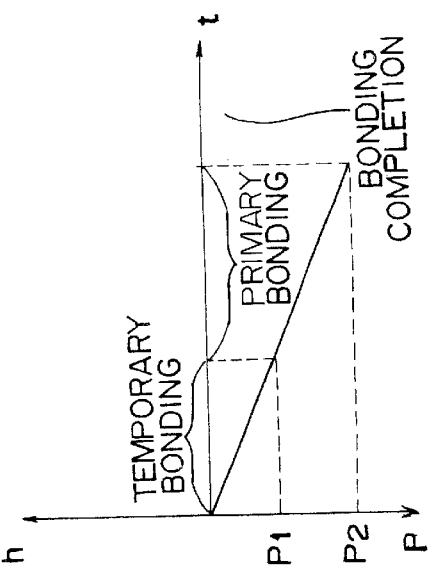
FIG. 29 is a graph showing a relation between load and time in a case where the temporary bonding and the primary bonding are performed by load control by the friction bonding apparatus and method of the first embodiment.

Furthermore, FIG. 29 is a graph showing a relation between load and time in a case where the temporary bonding and the primary bonding are performed by load control, according to the aforementioned friction bonding apparatus and method. That is, the load P effected on the bumps 3 and the wiring lines (lands) 4 via the suction nozzle 11 is controlled, and the temporary bonding is completed when the load becomes $P_1$. The suction nozzle 11 is moved further downward by the voice coil motor 69 when the temporary bonding is completed, and the primary bonding is completed when the load becomes $P_2$.

Among the aforementioned various control methods, the height control generally tends to be complicated, and therefore, the load control of FIG. 29 is preferable from the viewpoint of easiness of control, merit in bonding strength, and reproducibility. However, the primary bonding is required to be performed by height control, and height control is sometimes performed. The above is because the thickness control of the bumps 3, i.e., the collapse control of the bumps 3 can be achieved by executing height control, and the occurrence of troubles such as short-circuit due to excessive collapse and the failure in the entry of the resin sealant between the metallic bonding portions can be prevented.

Moreover, if the height control is additionally executed during the temporary bonding, the change in shape of the bumps 3 can be more accurately controlled.

Figure 30:
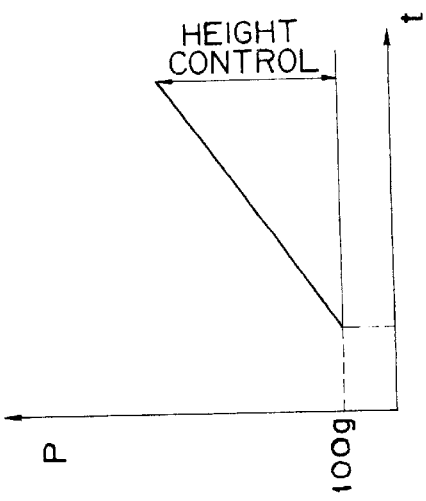
FIG. 30 is a graph showing a relation between the load and time for explaining the case of height control during bonding.

In this case, the detection of height is performed by, for example, a linear sensor 160, which is mounted on the voice coil motor 69, measures the current position of the suction tool 11 during the movement in the vertical direction, and outputs a detected value to the control unit 24. At this time, as shown in FIG. 30, it is preferable to perform pressurization until a load is applied to a certain extent (until all the bumps 3 are brought in contact with the wiring lines 4 and all the bumps 3 become regulated in height, and, in concrete, until 100 gf=980 mN, for example) and thereafter perform movement by a predetermined constant distance while measuring the amount of descent from the position by means of a linear scale 160 and outputting the detected value to the control unit 24. Moreover, the detection of the load is performed by a load sensor 161, which is mounted on the voice coil motor 69, detects the load effected by the downward movement of the suction nozzle 11, and outputs the detected value to the control unit 24.

When the friction bonding operation is stopped between the temporary bonding and the primary bonding instead of reduction, the stop time is preferably shorter. The reason for the above is to prevent the expansion of the bumps due to heat and to prevent the oxidation of the wiring lines 4, or in other words, the metallic electrode portions of the base member 2. In concrete, the stop time between the temporary bonding and the primary bonding is preferably about 10 ms.

Figure 35:
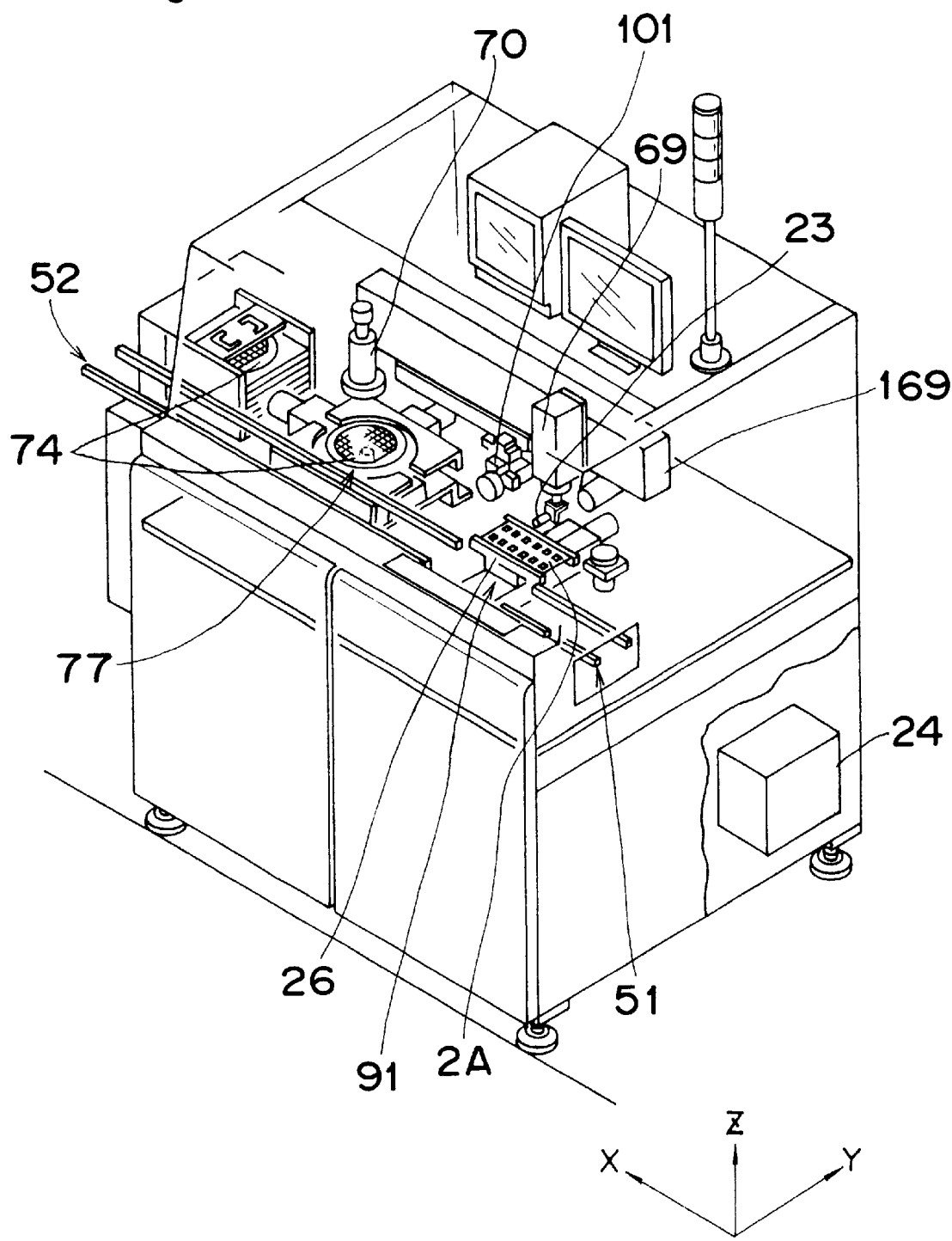
FIG. 35 is a perspective view of a friction bonding apparatus according to a fourth embodiment of the present invention, provided with one bonding head.

Moreover, as shown in FIG. 35, particularly when one bonding head 68 is provided, once the suction tool 11 and the semiconductor element 1 begin to slip with respect to each other due to vibrations, the slip is not extinguished no matter how the movement is made fast. However, if the bonding operation is reduced to provide certain moderate vibrations, there is produced an engagement portion (engagement portion as a consequence of tight engagement between the tool 11 and the semiconductor element 1 particularly when the variations halt), and the vibrations are efficiently transmitted.

Figure 4A:
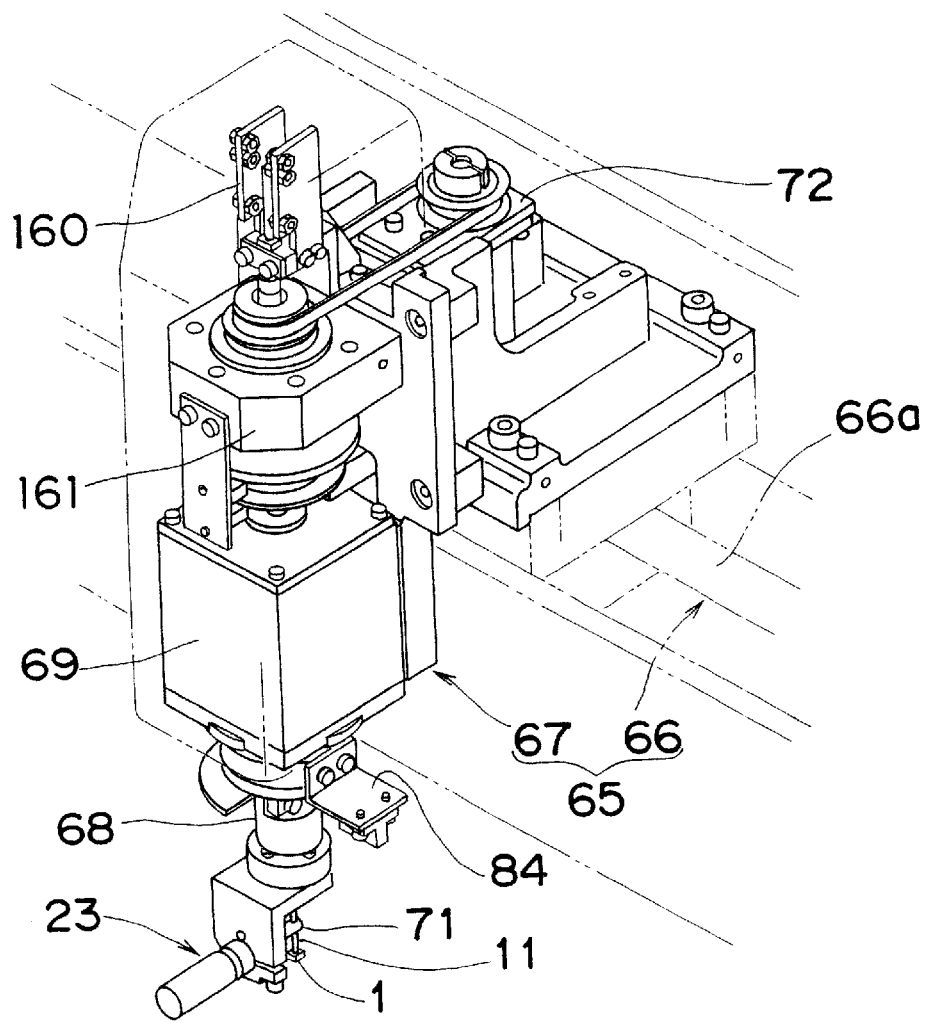
FIG. 4A is a perspective view of the bonding head of the bonding object handling unit of FIG. 2A and the bonding head in the friction bonding operation state of the unit.
Figure 4B:
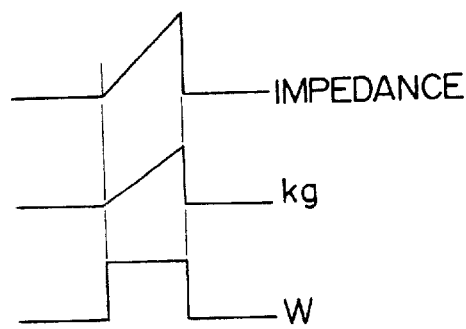
FIG. 4B is a graph showing a general friction bonding operation state performed conventionally.

Moreover, according to a relation between the ultrasonic output W, the load kg by pressurization, and the impedance of a ultrasonic horn 71 during the friction bonding shown in FIG. 4B, in the voice coil motor 69, which 4 vertically moves the suction tool 11 and pressurizes the semiconductor element 1 against the base member 2, the pressure increases after the contact of the metallic bumps 3 against the wiring lines 4 with the increasing ultrasonic output W, load kg, and so on. Consequently, the metallic bonding portions of the metallic bumps 3 and the wiring lines 4 or the like become hard to relatively move to each other as the diffusion bonding progresses, and the impedance of the ultrasonic horn 71 is increased during the dividing of the voice coil motor 69. Therefore, the proper end of the friction bonding can be decided by the event that this impedance comes to have a specified waveform or increases to a specified value, and the abnormality of the friction bonding can be decided by the event that the specified waveform cannot be obtained or becomes greater than a specified value.

In this case, the decision by the detection of the impedance is made as follows according to one example. The oscillator 23, which is one example of the relative movement unit, tries to supply a constant current and voltage to the piezoelectric element during the period when ultrasonic vibrations are effected on the bumps 3. Because of the heating of the wiring lines 4 and the occurrence of frictional heat due to the operation of the ultrasonic vibrations, the bumps 3 become gradually fixed to the electrode portions of the wiring lines 4, with which the bumps 3 gradually becomes hard to vibrate. The fact that the metallic bumps 3 gradually becomes hard to vibrate leads to the suppression of the variations of the piezoelectric element as described above, and consequently, the value of the current supplied from the oscillator 23 to the piezoelectric element gradually reduces. On the other hand, the voltage applied to the piezoelectric element is theoretically constant, and therefore, the impedance value of the piezoelectric element gradually increases as the metallic bumps 3 gradually becomes hard to vibrate, i.e., as the bonding of the metallic bumps 3 to the electrode portions of the wiring lines 4 progresses in conformity to the Ohm's law. The control unit 24 obtains a change in the impedance value by detecting a change in the value of current supplied from the oscillator 23 to the piezoelectric element, and decides whether the bonding between the metallic bumps 3 and the electrode portions of the wiring lines 4 is good or not on the basis of the change in the impedance value.

Therefore, the friction bonding can be performed under various conditions while monitoring the ultrasonic output W, the load kg, and the impedance.

Accordingly, if the initial friction bonding operation before the reduction or stop is performed by controlling the pressurization of the semiconductor element 1 and the base member 2 against each other and the final friction bonding operation after the reduction or stop is performed by controlling the degree of adjacency, i.e., the distance between the semiconductor element 1 and the base member 2, or in other words, a height (for example, height from the surface of the base member 2) as described hereinabove, then it is enabled to prevent the required characteristics from becoming defective as a consequence of the adjacency between the semiconductor element 1 and the base member 2 than the specified distance in the final friction bonding stage for the achievement of a sufficient bonding state and then the excessive collapse of the metallic bumps 3 and the wiring lines 4 by satisfying the half-finished bonding state while the objects to be bonded to each other is prevented from coming close to or exceeding the distance between the semiconductor element 1 and the base member 2 in the final friction bonding stage due to the pressurization in the initial friction bonding stage and securing the transition from the half-finished bonding state into the sufficient bonding state of the metallic bumps 3 and the wiring lines 4 during the final frictional bonding utilizing a specified margin in the distance between the objects to be bonded to each other under sufficient pressurization.

Furthermore, if the initial friction bonding operation is performed for a time shorter than the final friction bonding operation time, then it is enabled to prevent the required characteristics from becoming defective as a consequence of the excessive collapse of the metallic bumps 3 and the wiring lines 4 due to the half-finished bonding state during the initial frictional bonding operation in securing the required final bonding state by performing the final friction bonding operation for a sufficient time longer than the initial friction bonding operation time.

Moreover, if the initial friction bonding operation before the reduction or stop (halt) is performed by controlling the distance between the objects to be bonded to each other and the final friction bonding operation after the reduction or stop is performed by controlling the pressurization of the objects to be bonded to each other as described hereinabove, it is enabled to prevent the required characteristics from becoming defective as a consequence of the semiconductor element 1 and the base member 2 which come closer to each other than the specified distance due to the pressurization in the final friction bonding stage for the achievement of a sufficient bonding state and then the excessive collapse of the metallic bumps 3 and the wiring lines 4, or prevent the sealant from becoming hard to enter or failing in entering the space between the objects to be bonded to each other, such as the semiconductor element 1 and the base member 2, by satisfying the half-finished bonding state while the distance between the metallic bumps 3 and the wiring lines 4 during the initial friction bonding is prevented from coming close to or exceeding the distance at the time of end of the final friction bonding and securing the transition from the half-finished bonding state into the sufficient bonding state of the semiconductor element 1 and the base member 2 utilizing the specified margin in the distance between the semiconductor element 1 and the base member 2 in the final friction bonding stage.

Furthermore, it is enabled to obtain the half-finished bonding state of the semiconductor element 1 and the base member 2 within a specified range of distance in the initial friction bonding operation by performing the initial friction bonding operation by the control of distance between the semiconductor element 1 and the base member 2 and controlling the distance between the semiconductor element 1 and the base member 2 in the final friction bonding operation on the basis of the control data at this time, and secure a sufficient final friction bonding state without excessive adjacency of the semiconductor element 1 to the base member 2 in the final friction bonding operation corresponding to the margin to the specified distance based on the control data of the distance between the semiconductor element 1 and the base member 2 in this initial friction bonding stage.

If the impedance of the voice coil motor 69 for pressurization-use driven in the initial friction bonding operation is monitored and the final friction bonding operation is controlled according to this in performing the friction bonding by means of ultrasonic vibrations as described above, then it is enabled to achieve the final friction bonding state neither too much nor too little or prevent the execution of wasteful final friction bonding operation by weakening, strengthening, or stopping (halting) the final friction bonding operation in accordance with the excess or deficiency and the limitation of the following friction bonding on the basis of the difference in impedance corresponding to the excess or deficiency and the limitation of the friction bonding of the metallic bumps 3 and the wiring lines 4, which are the metallic bonding portions, during the initial friction bonding.

Figure 4C:
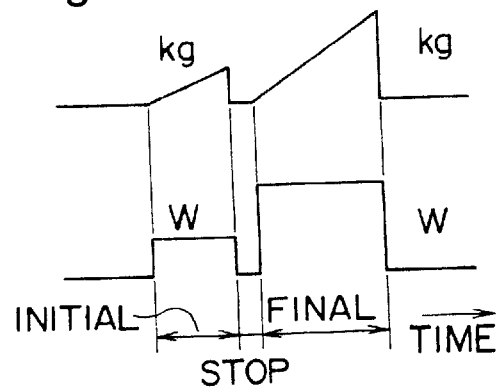
FIG. 4C is a graph showing one example of the friction bonding operation state in the friction bonding apparatus of the first embodiment of the present invention.
Figure 8:
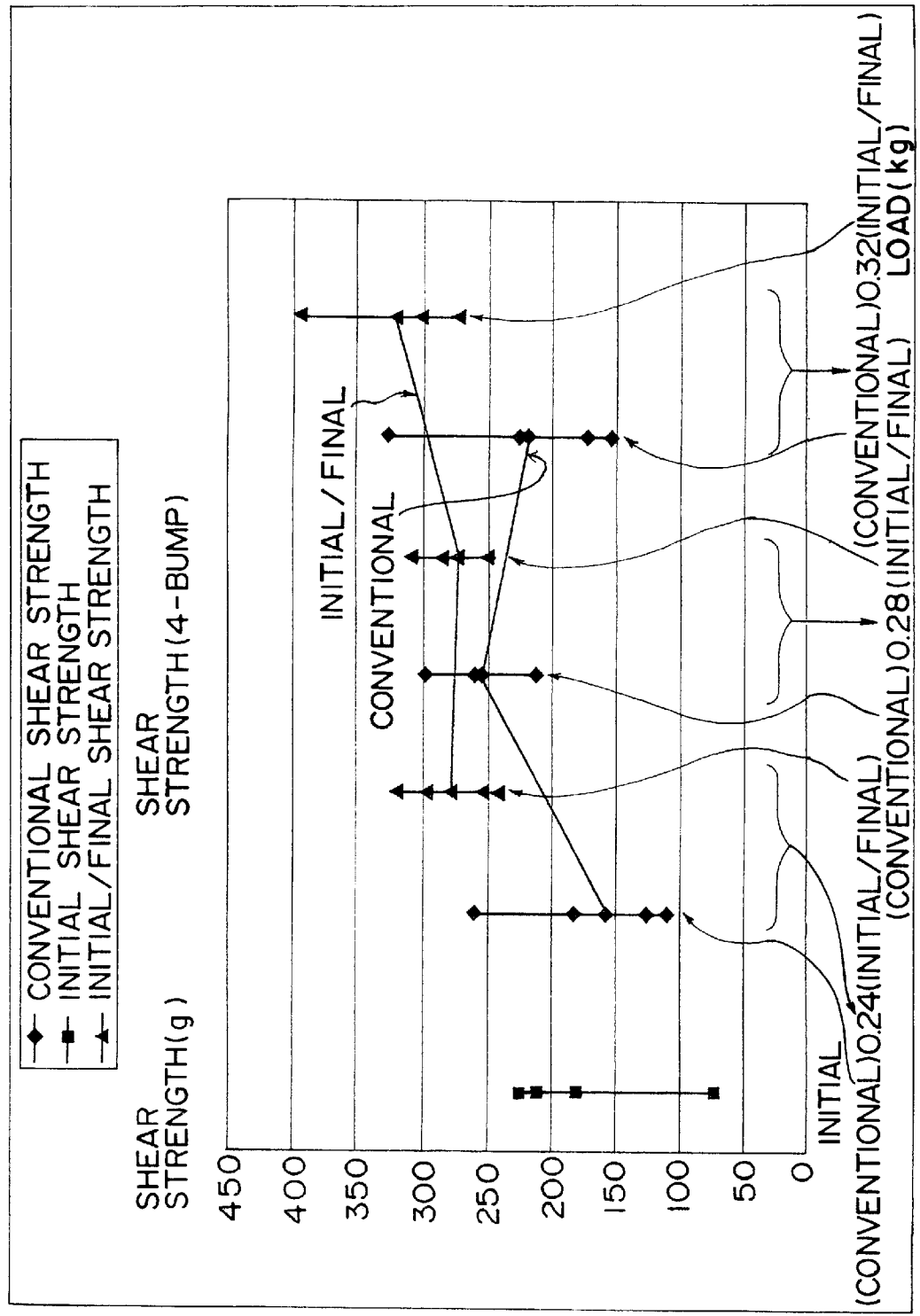
FIG. 8 is a graph showing the experiment results of comparison of the shear strength of the metallic bonding portion of the 4-bump semiconductor element between the case of the friction bonding of the first embodiment of the present invention and the conventional case.
Figure 9:
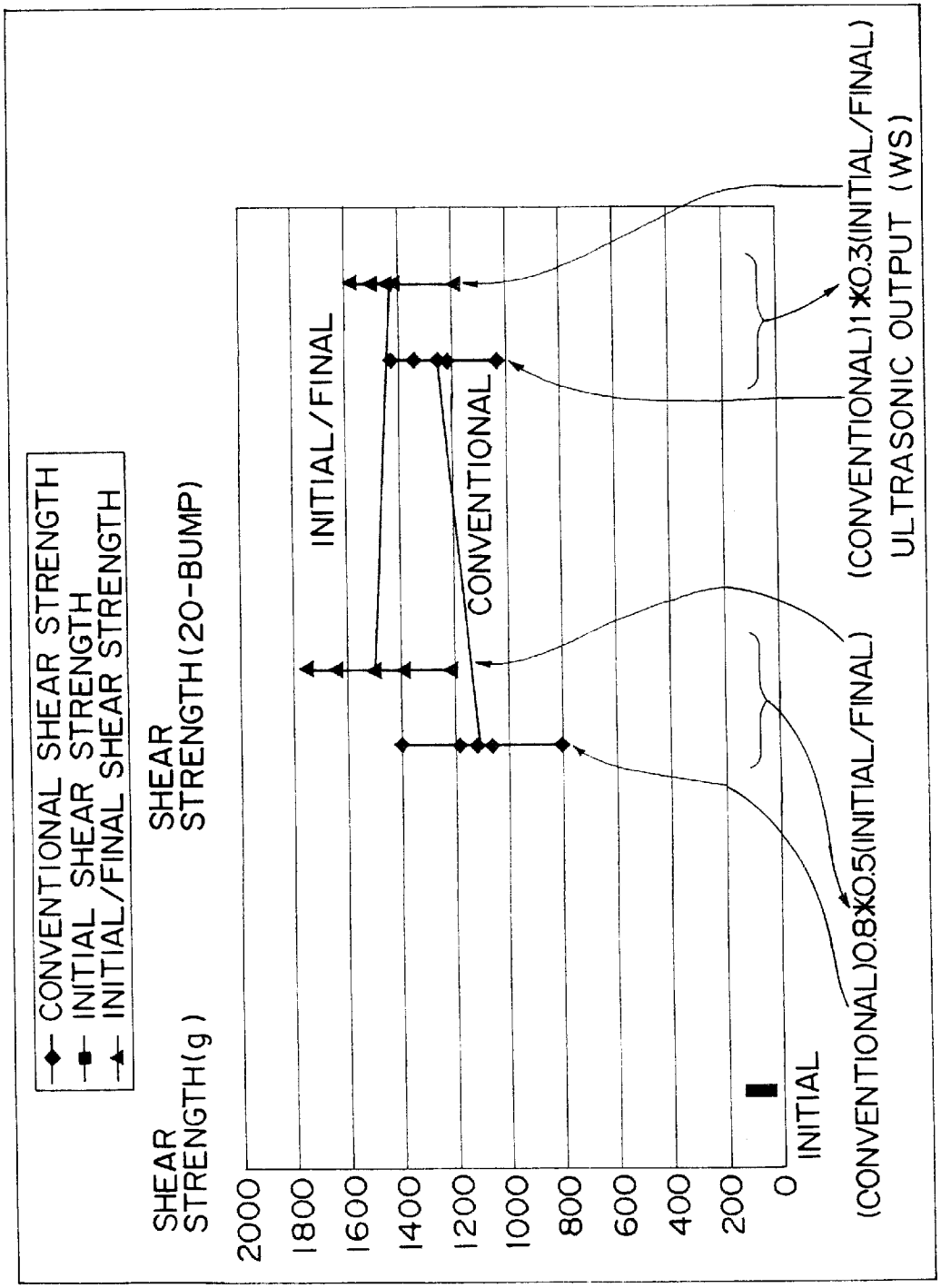
FIG. 9 is a graph showing the experiment results of comparison of the shear strength of the metallic bonding portion of the 20-bump semiconductor element between the case of the friction bonding of the first embodiment of the present invention and the conventional case.

The above-mentioned control is executed on a semiconductor element 1 that has four bumps as shown in FIG. 7A and a semiconductor element 1 that has twenty bumps as shown in FIG. 7B with the time allocation, the load change, and the distribution of ultrasonic output W as shown in FIG. 4C for the execution of the initial friction bonding, stopping (halting) and final bonding, and the control is compared with that of the conventional method for continuously performing the initial friction bonding and the final friction bonding as shown in FIG. 4B. Then, the results as shown in FIG. 8 and FIG. 9 are obtained, and the shear strength is improved in the case of the friction bonding stopped (halted) partway by comparison with the conventional continuous friction bonding. That is, FIG. 8 is a graph of the experimental results of the shear strength of the metallic bonding portions obtained when the initial friction bonding, stopping (halting), and final friction bonding are performed by the friction bonding of the first embodiment of the present invention with the semiconductor element that has four bumps and the shear strength of the metallic bonding portions obtained when the initial friction bonding and the final bonding are continuously performed in the conventional case. FIG. 9 is a graph of the experimental results of the shear strength of the metallic bonding portions obtained when the initial friction bonding, stopping (halting), and final friction bonding are performed by the friction bonding of the first embodiment of the present invention with the semiconductor element that has twenty bumps and the shear strength of the metallic bonding portions obtained when the initial friction bonding and the final bonding are continuously performed in the conventional case. In FIG. 8 and FIG. 9, the same values are indicated with a shift in the case of the present embodiment and the conventional case for better understanding. For example, when a load of 0.24 kg is effected in FIG. 8, the variations in the shear strength are indicated in a manner that the variation in the conventional case is shown on the left-hand side and the variation in the case of the present embodiment is shown on the right-hand side. The shear strength in the conventional case is varied within a wide range of about 110 g to about 260 g, whereas the shear strength in the present embodiment is varied within a narrower range of about 240 g to about 330 g and the mean value is higher than in the conventional case. The same tendency is observed in the other case of the load of 0.28 kg and 0.32 kg. Moreover, in FIG. 9, the numerical value of 0.8★0.5 means energy of an ultrasonic output of 0.8 W applied for 0.5 seconds. The numerical value of 1★0.3 means energy of an ultrasonic output of 1 W applied for 0.3 seconds. Also, in FIG. 9, the shear strength in the case of the present embodiment is varied within a narrower range than in the conventional case and a higher mean value than the conventional one is observed, similarly to the case of FIG. 8. It is to be noted that the initial load value only in the initial stage (only during the temporary bonding) of FIG. 8 is 0.2 kg, and the IC size is a square having a side of 2 mm. The initial ultrasonic output only in the initial stage (only during the temporary bonding) of FIG. 9 is 0.2 W applied for a time of 0.1 seconds, and the IC size is a square having a side of 2 mm.

Second Embodiment

Figure 10:
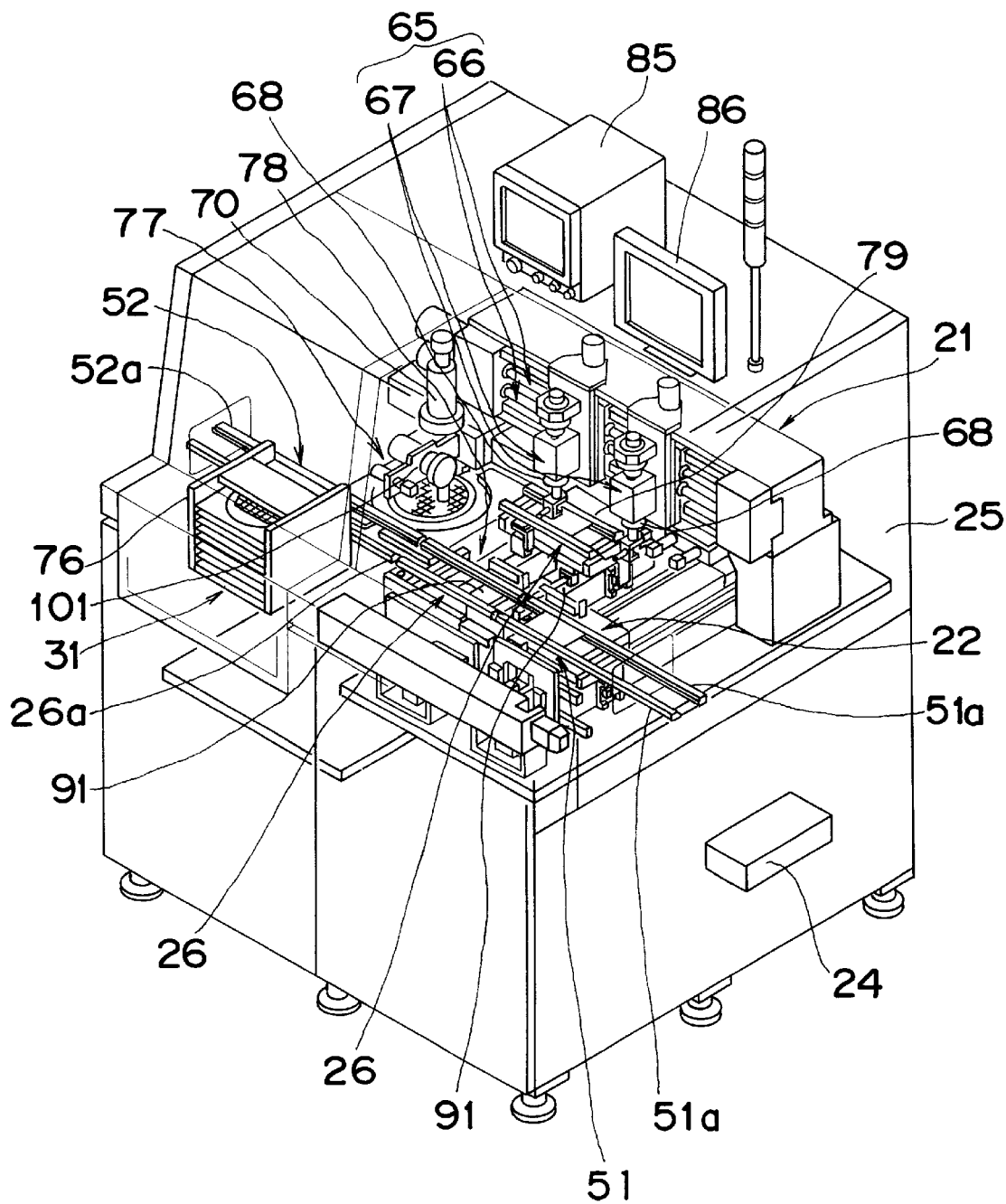
FIG. 10 is a perspective view showing a friction bonding apparatus according to a second embodiment different from the friction bonding apparatus of FIG. 1.

The second embodiment of the present invention shown in FIG. 10 is provided with two positioning sections 26, and two bonding heads 68, the loading section 51, and the unloading section 52 can be used by switching of a movement mechanism 91. According to this arrangement, while performing the loading, positioning, and unloading of the objects to be bonded, such as the frame portions 2d that have the base members 2, in these two positioning sections 26 at different times, the one objects to be bonded are alternately subjected to the frictional bonding to each of the other objects to be bonded, such as the one semiconductor element 1 handled by the bonding object handling unit 21. By this operation, the loading, positioning, and unloading of the one object to be bonded, such as the frame portion 2d that has the base members 2, are singly performed, or even if a time longer than the time for handling the other object to be bonded, such as the semiconductor element 1, before and after the frictional bonding is taken because the position switching operation, the holding operation, and the holding release operation become complex, the time needed for repetitively subjecting the one object to the friction bonding to an object to be bonded, i.e., the other object to be bonded, such as the semiconductor element 1, handled by the bonding object handling unit 21 is reduced by half. Therefore, the work efficiency is improved.

Moreover, when there is the failure or damage of one positioning section 26 itself being used in a mode in which the one positioning section 26 is only continuously used, or when the object to be bonded, such as the frame 2d that has the base members 2 held by the one positioning section 26, has a problem, the friction bonding operation can be continued as usual by the other positioning section while tackling the problem. Therefore, the reduction in the operation rate can be avoided. The other construction and the effect and operation of the second embodiment are not changed from those of the first embodiment shown in FIG. 1 through FIG. 6, and therefore, neither redundant illustration nor explanation is provided.

Third Embodiment

Figure 32:
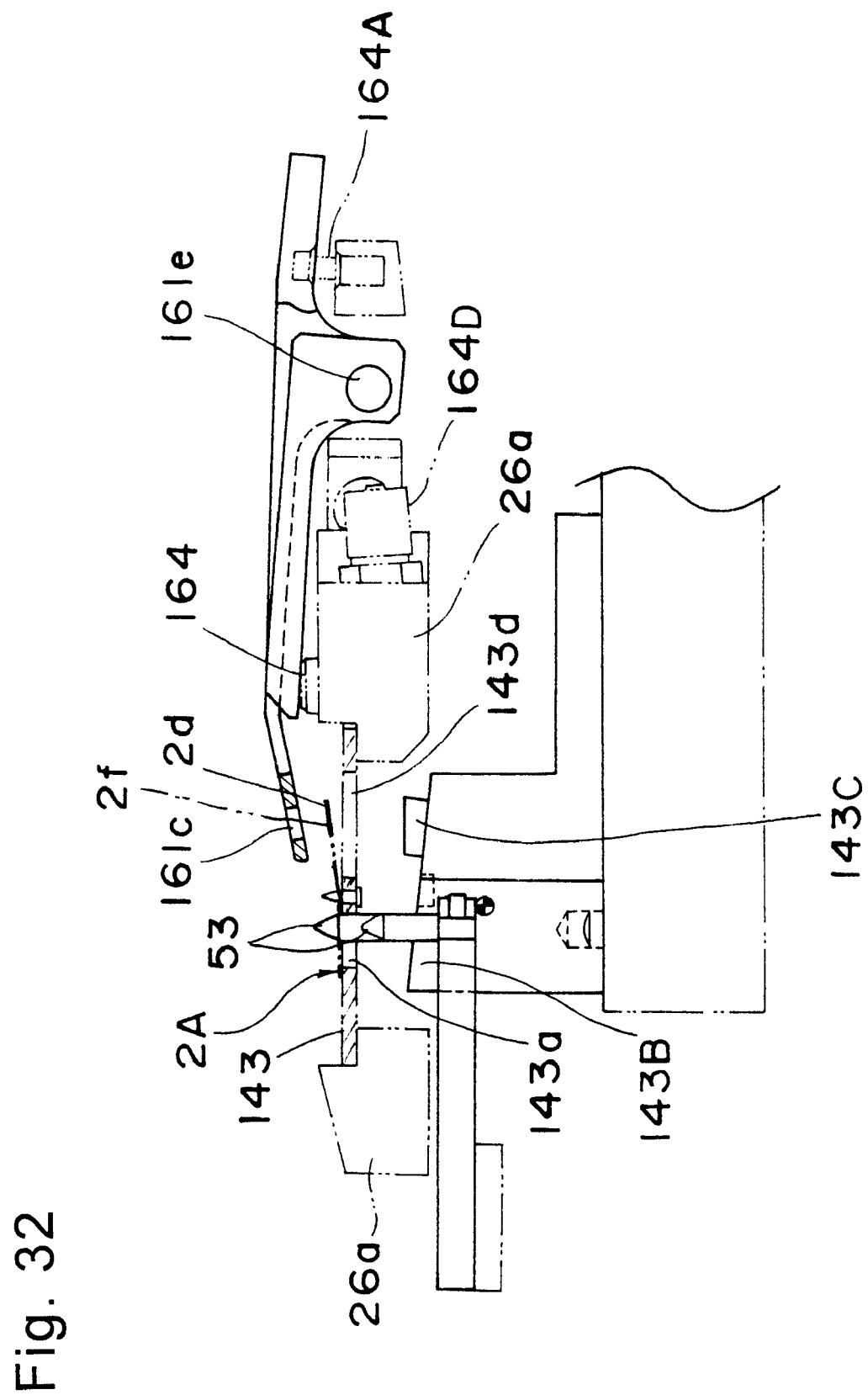
FIG. 32 is a detailed right-hand side view of the positioning section of the friction bonding apparatus of FIG. 31 in a state in which the object to be bonded is positioned in a unloading/loading position.
Figure 33:
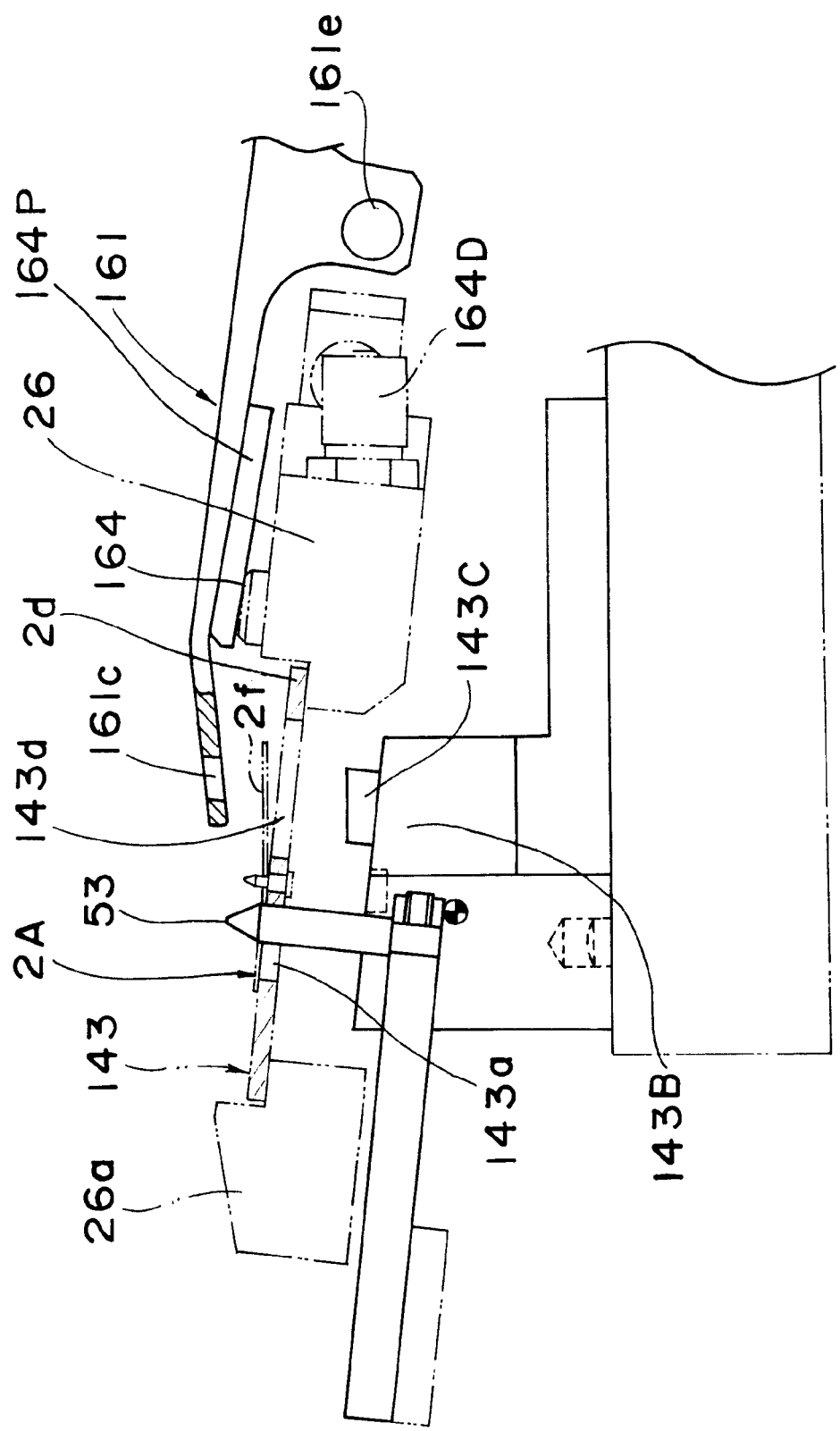
FIG. 33 is a detailed right-hand side view of the positioning section of the friction bonding apparatus of is FIG. 31 in a state in which the object to be bonded is inclined while being positioned in the bonding position from the unloading/loading position but not held by the pressurizing leaf.
Figure 34:
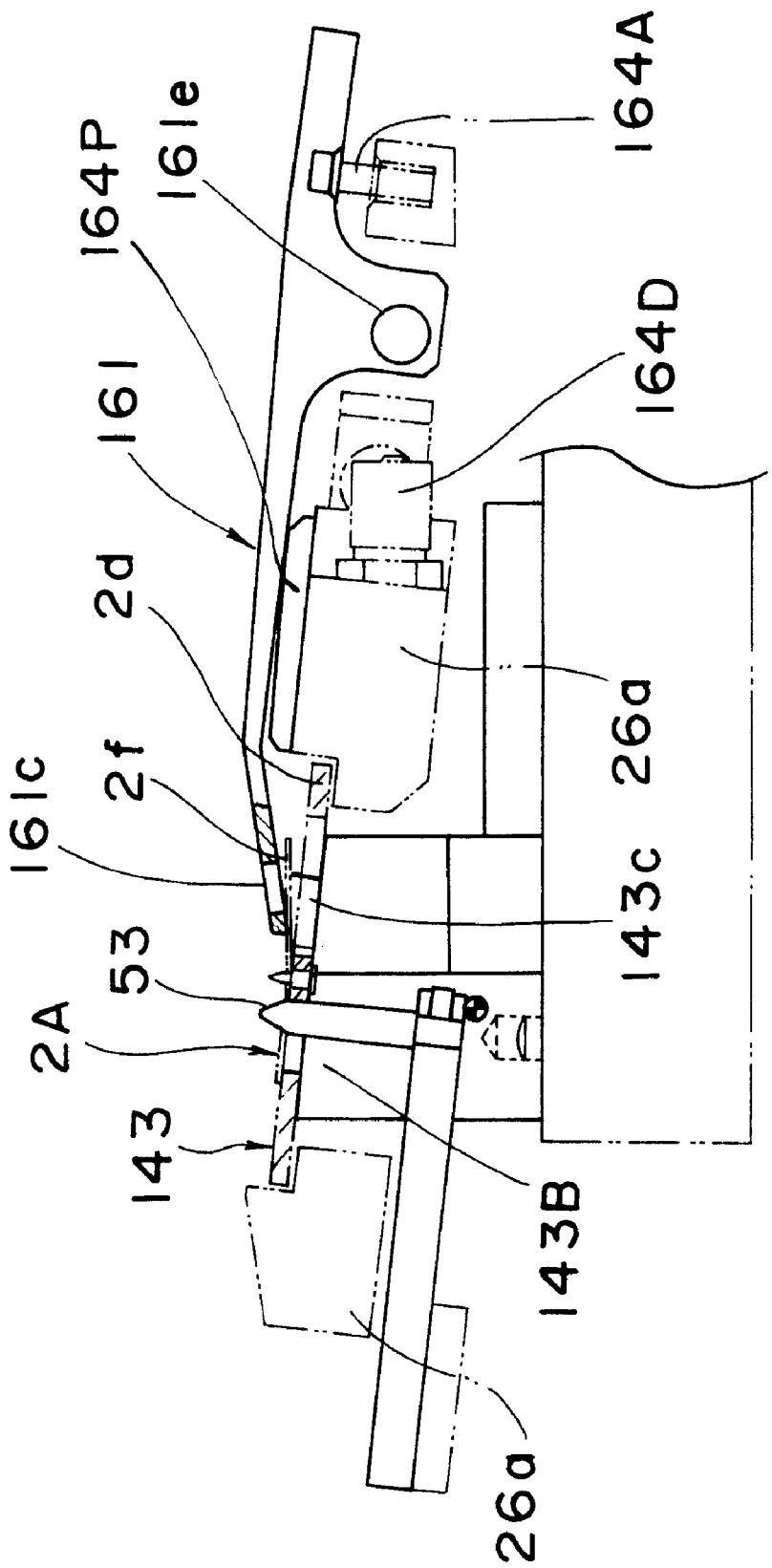
FIG. 34 is a detailed right-hand side view of the positioning section of the friction bonding apparatus of FIG. 31 in a state in which the object to be bonded is inclined while being positioned in the bonding position from the unloading/loading position and held by the pressurizing leaf.

As a friction bonding apparatus capable of putting the friction bonding method of the third embodiment of the present invention into practice, as shown in FIG. 31 through FIG. 34 and indicated by the one-dot chain lines 200 in FIG. 11, it is acceptable to pressurize only the free end of each base member 2 by means of a pressurizing leaf 161b as indicated by the one-dot chain lines 200 in FIG. 11 instead of exposing the portion to which the semiconductor elements 1 is to be bonded inside the through hole 61c of the pressurizing leaf 61b, so that no pressurizing member exists in the portion to which the semiconductor element 1 is to be bonded, enabling the prevention of contact with the suction tool 11. The through hole 161c of the pressurizing leaf 161b is to expose the read portion 2c and to prevent the pressurizing leaf 161b from damaging the read portion 2c by pressurization. In FIG. 31 through FIG. 34, reference numeral 143 denotes a suction and holding plate that is arranged between a pair of rails 26a and performs the unloading, loading, positioning, suction, and holding of the base member assembly 2A, reference numeral 143a denotes a suction hole that enables the suction of a portion in a vicinity of the base portion 2a of each base member 2 of the base member assembly 2A to the suction and holding plate 143, and reference numeral 143d denotes a through hole. Reference numeral 143C denotes a projecting portion that projects upward and belongs to a backup section 143B corresponding to the backup section 43 of the foregoing embodiment, and this projecting portion 143C enters the inside of the through hole 143d of the suction and holding plate 143 and supports the lower surface of the inclined portion 2f of each base member 2. Reference numeral 161e denotes a pivot shaft of the pressurizing member 161, and each pressurizing leaf 161b of the pressurizing member 161 is constructed of a roughly T-figured member as shown in FIG. 32, and its one end is provided with a spring 164A, which is consistently urged around the pivot shaft 161e so that the other end portion of the pressurizing member 161 approaches the projecting portion 143C, enabling the holding of the inclined portion 2f of the base member 2. Therefore, the base member assembly 2A is unloaded and loaded on the suction and holding plate 143, positioned in the unloading/loading position on the suction and holding plate 143 by the stopper 53, and thereafter sucked and held on the suction and holding plate 143. The pivoting from the unloading/loading position to the bonding position is similar to that of the foregoing embodiment. According to this fourth embodiment, by preparatorily sucking and holding a portion in a vicinity of the base portion 2a of each base member 2 of the base member assembly 2A, the base member assembly 2A can be stably inclined and pivoted between the unloading/loading position and the bonding position. It is to be noted that the reference numeral 164D corresponds to the air cylinder 64 of the foregoing embodiment, and the reference numeral 164 corresponds to the piston rod for collectively holding and releasing the holding the pressurizing leaves 161b via an assisting plate 164P, which extends along the unloading/loading direction and is driven to vertically move by the air cylinder 64 of the foregoing embodiment.

Fourth Embodiment

As a friction bonding apparatus capable of putting the friction bonding method of the fourth embodiment of the present invention into practice, it is acceptable to provide only one bonding head 68 as shown in FIG. 35 instead of the two as shown in FIG. 1, make the suction tool 11 of the bonding head 68 suck and hold the semiconductor element 1 picked up by the bonding object inverting mechanism 101 in the pickup position, move the element 1 to the base member 2, and perform the initial friction bonding and the final friction bonding. In comparison with the foregoing embodiment, the structure of the present embodiment can be simplified by virtue of the provision of one bonding head 68.

By properly combining the arbitrary embodiments out of the aforementioned various embodiments, the effects owned by the respective embodiments can be produced.

As is apparent from the above description of the present invention, if the metallic bonding portions of the objects to be bonded to each other are subjected to friction bonding by relatively moving the objects to be bonded and pressurizing relative to each other, then the metallic bonding portions are frictionally bonded to each other with an increase in temperature, softening, melting, and diffusion bonding by friction, and the friction bonding operation is temporarily partway reduced or stopped. As a result, the metallic bonding portions and the objects to be bonded to each other hardly suffer damages as a consequence of reduced mechanical and thermal influences as in the case where their metallic bonding is performed at a stroke, and even a magnetic disk reading suspension head constructed of a thin leaf spring, which serves as one example of the object to be bonded, is hardly deformed, and the yield increases. Furthermore, the shear strength of the metallic bonding rather increases since the friction bonding operation is partway reduced or stopped, and the friction bonding is reliably achieved without problem. Accordingly, there can be performed metallic bonding neither too much nor too little without inflicting damage on the objects to be bonded to each other.

In this case, one object to be bonded can easily be conveyed and handled in a variety of ways when sucked and held by the holding tool or, for example, the suction tool. Therefore, the held one object to be bonded can be subjected to pressurization and relative movement relative to the other object to be bonded with their metallic bonding portions facing each other, and the other object to be bonded, which is only required to be positioned and held for the bonding, can simply be handled.

According to one example, the relative movement can be achieved simply and easily by only ultrasonically vibrating the one object to be bonded and merely applying ultrasonic vibrations to the object to be bonded held by the suction tool via the suction tool. In particular, by means of the ultrasonic vibrations, the relative movement can be obtained with minute high-speed variations, and even minute metallic bonding portions can sufficiently be frictionally bonded to each other within a short time without excessive collapse.

When one object to be bonded is sucked and held by the suction tool as one example of the holding tool and when the object to be bonded is received, sucked, and held by at least a pair of mutually opposed taper surfaces of the recess that is similar to the external form of the one object to be bonded formed on the suction surface of the suction nozzle and is smaller than the external form, the one object to be bonded is received by at least the pair of mutually opposed taper surfaces of the recess that is similar to the one object to be bonded located on the suction surface and is smaller than the external form while being sucked by the suction surface of the suction tool. The movement for the relative movement relative to the other object to be bonded and the ultrasonic vibrations both of which are given from or via the suction tool are transmitted without escape nor dislocation, enabling the friction bonding to be efficiently achieved. Moreover, there is no friction since the back surface of the one object to be bonded sucked by the suction tool is not floated from the suction surface and not dislocated. This enables the prevention of the occurrence of scratches due to the frictional contact between the back surface of the object to be bonded with the suction surface and the adhesion and deposition, on the suction surface, of chippings and foreign materials generated when the back surface of the object to be bonded suffers scratches, which may rather injure the back surface of the object to be bonded to be sucked and held and may cause the chipping and cracking, dissimilar to the conventional case. This enables the improvement of the yield and the prevention of the reduction in quality due to the scratches on the back surface.

The stop (halt) or reduction of the friction bonding operation can also be performed by, for example, stopping (halting) or reducing the relative movement between the metallic bonding portions or by stopping (halting) or reducing the pressurization between the metallic bonding portions. If the stop (halt) of pressurization is performed by separating the suction tool from the object to be bonded held by the suction tool, the influence of the pressurization can be completely eliminated. However, the stop (halt) state can be obtained merely by stopping (halting) the progress of pressurization, according to circumstances.

Moreover, for example, the reduction of the friction bonding operation can also be performed by reducing both the relative movement of the objects to be bonded to each other and the pressurization between the metallic bonding portions.

Moreover, the stop (halt) of the friction bonding operation can also be performed by stopping (halting) both the relative movement of the objects to be bonded to each other and the pressurization between the metallic bonding portions.

Moreover, if, for example, the initial friction bonding operation before the reduction or stop (halt) is executed by controlling the distance between the objects to be bonded to each other and the final frictional bonding after the reduction or stop (halt) is executed by controlling the pressurization of the objects to be bonded to each other, then it is enabled to prevent the required characteristics from becoming defective as a consequence of the adjacency of the objects to be bonded to each other than the predetermined distance due to the pressurization in the final friction bonding stage for the achievement of the sufficient final bonding state and the excessive collapse of metallic bonding portions by satisfying the half-finished bonding state while the objects to be bonded to each other is prevented from coming close to or exceeding the distance between the objects to be bonded to each other in the final friction bonding stage in terms of the adjacency, that is, the distance between the objects in the initial friction bonding stage and securing the transition from the half-finished bonding state into the sufficient bonding state of the metallic bonding portions during the final frictional bonding utilizing the specified margin in the distance between the objects to be bonded to each other.

Moreover, if, for example, the initial friction bonding operation before the reduction or stop (halt) is executed by controlling the pressurization of the objects to be bonded to each other and the final frictional bonding after the reduction or stop (halt) is executed by controlling the distance between the objects to be bonded to each other, then it is enabled to prevent the required characteristics from becoming defective as a consequence of the adjacency of the objects to be bonded to each other than the specified distance in the final friction bonding stage for the achievement of the sufficient bonding state and the excessive collapse of the metallic bonding portions by satisfying the half-finished bonding state while the objects to be bonded to each other is prevented from coming close to or exceeding the distance between the objects to be bonded to each other in the final friction bonding stage due to the pressurization in the initial friction bonding stage and securing the transition from the half-finished bonding state into the sufficient bonding state of the metallic bonding portions during the final frictional bonding utilizing the specified margin in the distance between the objects to be bonded to each other under sufficient pressurization.

Moreover, for example, if the initial friction bonding operation before the reduction or stop (halt) is executed for a time shorter than the time of the final friction bonding operation after the reduction or stop (halt), then it is enabled to prevent the required characteristics from becoming defective as a consequence of the excessive collapse of the metallic bonding portions due to the half-finished bonding state in the initial frictional bonding operation in securing the required final bonding state by executing the final friction bonding operation for a sufficient time longer than that of the initial friction bonding operation.

Moreover, for example, by executing the initial friction bonding operation before the reduction or stop (halt) with the control of distance between the objects to be bonded to each other and controlling the distance between the objects to be bonded to each other in the final frictional bonding operation after the reduction or stop (halt) on the basis of the control data at this time, it is enabled to obtain the half-finished bonding state in which the objects to be bonded to each other are located within the predetermined range of distance in the initial friction bonding operation and secure the sufficient final friction bonding state without excessive adjacency of the objects to be bonded to each other during the final friction bonding operation corresponding to the margin to the predetermined range of distance on the basis of the control data of the distance between the objects to be bonded to each other in this initial friction bonding stage.

If, for example, the impedance of the ultrasonic horn connected to the oscillator (23) attached onto the holding tool in the initial friction bonding operation before the reduction or stop (halt) is monitored and the final friction bonding operation after the reduction or stop (halt) is controlled according to this in performing the friction bonding by means of ultrasonic vibrations, then it is enabled to achieve the final friction bonding state neither too much nor too little or prevent the execution of wasteful final friction bonding operation by weakening, strengthening, or stopping (halting) the final friction bonding operation in accordance with the excess or deficiency and the limitation of the bonding on the basis of the difference in impedance corresponding to the excess or deficiency and the limitation of the friction bonding of the metallic bonding portions during the initial friction bonding with the impedance reflecting the progress degree and limitation of the friction bonding.

Moreover, the friction bonding apparatus is provided with: the two bonding object handling units that can hold two objects to be bonded to each other and position the objects respectively so that their metallic bonding portions face each other; the relative movement unit that can bring the opposed metallic bonding portions of the two objects to be bonded to each other into frictional contact with each other by relatively moving the objects to be bonded to each other held by the two bonding object handling units relative to each other; and the control unit that can control the holding and positioning of the objects to be bonded to each other by the bonding object handling units and the relative movement of the bonding object handling units by the relative movement unit so as to make the metallic bonding portions of the objects to be bonded to each other held by the bonding object handling units face each other and perform the metallic bonding by bringing the objects into frictional contact with each other by the relative movement. If the control unit is made to temporarily partway reduce or stop (halt) the friction bonding operation, then the friction bonding partway reduced or stopped (halted) can be automatically reliably achieved.

Moreover, for example, the relative movement unit is only required to move one of the bonding object handling units so as to relatively move the one relative to the other, and it is preferable to perform the movement of one of the bonding object handling units by the relative movement unit by means of ultrasonic vibrations, as described above.

Moreover, in a case where the bonding object handling unit located on the side that the movement for the relative movement is not performed has, for example, a positioning section, which receives the object to be bonded, holds and positions the object, subjects the object to the friction bonding, and unloads the object after the friction bonding, if the object to be bonded that has a plurality portions to be frictionally bonded to the other objects to be bonded is positioned once, then it is only required to perform the friction bonding still on the positional criterion common to each friction bonding portion of the positioned object to be bonded by repetitively handling the other objects to be bonded by means of the bonding object handling unit corresponding to the other objects. This simplifies the handling of the object to be bonded having a plurality of portions to be frictionally bonded to the other objects to be bonded as well as the structure of the bonding object handling unit that can handle the object.

In the friction bonding apparatus described above, one object to be bonded out of the two objects to be bonded to each other is handled by, for example, one bonding object handling unit out of the two bonding object handling units. The one object to be bonded is, for example, an object to be bonded having a frame portion and the metallic bonding portions in the inclined portion that extends from this frame portion into the frame portion and is inclined relative to the frame portion. The one bonding object handling unit has, for example, the positioning section for positioning and holding the frame portion of the one object to be bonded. The positioning section, for example, can be moved into the unloading/loading position where the one object to be bonded is loaded and unloaded with the frame portion of the one object to be bonded held and guided along the conveyance surface and the bonding position where the inclined portion of the one object to be bonded holding and positioning the frame portion is inclined so as to extend along the conveyance surface and the metallic bonding portion owned by the inclined portion is subjected to the metallic bonding. The one bonding object handling unit is further provided with: for example, the position switching unit for switching the positioning section between the unloading/loading position and the bonding position; and the backup section for performing backup so that the inclined portion of the one object to be bonded positioned by the positioning section is backed up from below when the positioning section is switched to the bonding position. The control unit is also, for example, able to switch the positioning section between the unloading/loading position and the bonding position by controlling the position switching unit according to the loading, unloading, positioning, and bonding operations of the one object to be bonded.

With the above-mentioned construction, the object to be bonded provided with the portion to be frictionally bonded to the other object to be bonded is handled and subjected to friction bonding by the bonding object handling unit. Therefore, the objects to be bonded, which are hard to handle due to the fact that the objects have, for example, a very small size or a various shape or are thin vibratory objects, are integrally formed into a flat frame, handled wholly collectively with a large frame portion, so that the objects are successively subjected to friction bonding to a plurality of objects to be bonded. In such a case, the positioning section can hold and guide the frame portion of the objects to be bonded. The inclined portion, which is inclined with respect to the frame portion of the objects to be bonded positioned by being moved into the specified inclined position by the control unit and the position switching unit in the positioned state, is put in a posture along the conveyance surface and positioned again so as to be backed up by the backup section while performing the loading, unloading, and positioning similarly to the handling of general plate-shaped objects such as a circuit board still in the unloading/loading position along the conveyance surface. This enables the object to be subjected to the friction bonding to the other object to be bonded the required times without difficulties by the bonding object handling unit that is handling the object, similarly to the case of the general plate-shaped object positioned along the conveyance surface. Even when the inclined portion and the member that has the inclined portion are made of a spring leaf that is easily vibrated or deformed, sufficient friction bonding can reliably be performed without inflicting damage such as deformation and injury on the leaf. The positioning section can perform the unloading of the object to be bonded, to a plurality of places of which the other object to be bonded has been frictionally bonded, and the loading of a new object to be bonded by being put back to the unloading/loading position along the conveyance surface by the control unit and the position switching unit when the friction bonding ends.

In this case, if there is provided with a pair of guide rails for holding and guiding the frame portion of the object to be bonded so that the positioning section and the loading section and the unloading section, which are located on both sides of the positioning section and can perform the loading and unloading of the object to be bonded between the loading and unloading sections and the positioning section are continuously arranged so as to enable the frame portion to be conveyed in one direction, then the unloading of the object to be bonded after the friction bonding and the loading of a new object to be bonded in the positioning section can simply be achieved by the conveyance in a linear direction extending through the unloading section and the loading section.

Moreover, if one of the guide rails of the positioning section is provided with a stopper, which can advance toward the other guide rail, clamp the frame portion of the object to be bonded received and positioned in the positioning section between the stopper and the other guide rail, and can retreat to release the clamping, and the control unit can make the stopper advance every time the object to be bonded is received and positioned in the positioning section and retreat every time the bonding operation ends, then the dislocation due to the movement for the relative movement and the vibrations of the other object to be bonded can be prevented by making the control unit and the stopper clamp the frame portion immovable when the frame portion is loaded into the positioning section and positioned in the specified position, enabling the friction bonding to be performed with higher positional accuracy.

There are provided the pressurizing member supported by one guide rail of the positioning section so that the inclined portion owned by each spring leaf is able to be held between the pressurizing member and the backup section or to release the holding even when the inclined portion of the object to be bonded is formed at the tip portion of the spring leaf that extends into the frame portion, and the switching unit for switching this pressurizing member between the holding position and the holding release position at a portion between the switching unit and the guide rail, and the control unit can put the pressurizing member into the holding position every time the object to be bonded is received and positioned in the positioning section and can put the pressurizing member into the holding release position every time the bonding operation ends. With this arrangement, by putting the holding member into the holding position by the control unit and the position switching unit when the positioning section subjects the object to be bonded to the friction bonding so that the inclined portion of the object is backed up by the backup section with the inclined portion extended along the base member conveying surface, the inclined portion located at the tip portion of the spring leaf can be prevented from being vibrated, dislocated, or deformed in the friction bonding stage with the inclined portion held between the holding member and the backup section, and this enables sufficient friction bonding to be secured without inflicting damage on the spring leaf. By putting the holding member in the holding release position after the friction bonding, there is no obstruction to the unloading of the object to be bonded from the positioning section after the frictional bonding and the loading of a new object to be bonded.

If the pressurizing member is provided with the penetration windows through which independent pressurizing leaves corresponding to the spring leaves can hold a plurality of spring leaves in an overlapping manner and can release the holding and the metallic bonding portions of the inclined portion of the spring leaves are exposed to the pressurizing leaves and subjected to friction bonding, by individually holding the plurality of spring leaves by the independent pressurizing leaves corresponding to the spring leaves, it can be guaranteed to hold them without mutual influence nor stress and perform the friction bonding with the aforementioned high accuracy with no obstruction exerted from the pressurizing leaves via the penetration window owned by each pressurizing leaf even there is a difference in position, shape, and so on for each of the spring leaves and for each of the pressurizing leaves.

If the bonding object handling unit on the side that the movement for the relative movement is performed has: the suction tool, which picks up the supplied object to be bonded by suction and holding, conveys the object, brings the object into frictional contact with the object to be bonded held by the bonding object handling unit in which the movement for the relative movement is not performed with their metallic bonding portions facing each other and subjects them to the friction bonding; and the movement unit of this suction tool, then there is the advantage that the friction bonding between the opposed metallic bonding portions of the object and the other object to be bonded can be performed at high speed without stress by applying the movement for the relative movement and variations to the held object to be bonded of which the size and weight are small by comparison with those of the other object to be bonded for the reason that only one portion to be frictionally bonded to the other object to be bonded exists or for a similar reason.

If two bonding object handling units are provided on the side that the movement for the relative movement is performed, then, by setting the specifications corresponding to each application for the initial friction bonding and the final friction bonding with interposition of the reduction or stop (halt) of the friction bonding and properly using the same, the stop (halt) conditions of the friction bonding between the initial friction bonding and the final friction bonding can be satisfied by switching the bonding object handling unit to be used for the initial friction bonding and the final friction bonding while stably achieving two types of friction bonding on the different conditions of the initial friction bonding and the final friction bonding without executing the complicated and delicate control. Moreover, when one bonding object handling unit itself suffers failure, damage, and limitation of durability or the object to be bonded held by the unit has a problem, the friction bonding operation can be continued as usual by the other bonding object handling unit while tackling the problems, and therefore, the reduction in the operation rate can be avoided.

If two positioning sections are provided, while performing the loading, positioning, and unloading of the objects to be bonded in the two positioning sections at different times, by alternately subjecting the objects to be bonded to the friction bonding to the other object to be bonded handled by one bonding object handling unit, the loading, positioning, and unloading of one object to be bonded are singly performed, or even if a time longer than the time for handling the other object to be bonded before and after the frictional bonding is taken because the position switching operation, the holding operation, and the holding release operation become complex, the time needed for repetitively subjecting the object to the friction bonding to the other one object to be bonded handled by one bonding object handling unit is reduced by half. Therefore, the work efficiency is improved. Moreover, when one bonding object handling unit itself suffers failure, damage, and limitation of durability or the object to be bonded held by the unit has a problem, the friction bonding operation can be continued as usual by the other bonding object handling unit while tackling the problems, and therefore, the reduction in the operation rate can be avoided.

The friction bonding apparatus of the present invention may be provided with the friction bonding apparatus in each of the cases and the supply unit for supplying at least one of a pair of objects to be bonded to each other to the bonding object handling unit that can handle it.

In the above-mentioned construction, while automatically supplying the object to be bonded in which many objects to be bonded are individually handled at least from the supply unit every time at need, the aforementioned friction bonding operation can be successively repetitively performed between the object to be bonded and the other different object to be bonded manually supplied or automatically supplied every time at need from the supply unit. The manufacturing of a variety of secondary products and final products can be achieved automatically, easily and reliably at high speed by frictionally bonding the objects to be bonded to each other in a one-to-one correspondence or one-to-plural correspondence for the mounting of one on the other.

The aforementioned characteristics of the present invention can be used singly as far as possible or in a complex form of various combinations.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A friction bonding method comprising:
   temporarily reducing or stopping a friction bonding operation partway when a semiconductor element and a circuit forming body, which are two objects to be bonded to each other, are pressurized against each other and relativity moved to put a plurality of metal electrode portions of the semiconductor element and a plurality of metal electrode portions of the circuit forming body, as metallic bonding portions, into frictional contact with each other so as to perform friction bonding of the metallic bonding portions.

2. A friction bonding method as claimed in claim 1, wherein the temporary reduction of the friction bonding operation is performed by reducing the relative movement between the metallic bonding portions.

3. A friction bonding method as claimed in claim 1, wherein the temporary stop of the friction bonding operation is performed by stopping the relative movement between the metallic bonding portions.

4. A friction bonding method as claimed in claim 2, wherein the temporary reduction or stop of the friction bonding operation is performed by stopping the pressurization between the metallic bonding portions.

5. A friction bonding method as claimed in claim 4, wherein the stop of the pressurization is performed by separating the holding tool away from the one object to be bonded held by the tool.

6. A friction bonding method as claimed in claim 1, wherein the reduction of the friction bonding operation is performed by reducing the relative movement of the objects to be bonded to each other and the pressurization between the metallic bonding portions.

7. A friction bonding method as claimed in claim 1, wherein an initial friction bonding operation before the reduction or stop is performed by controlling a distance between the objects to be bonded to each other, and a final friction bonding operation after the reduction or stop is performed by controlling the pressurization between the objects to be bonded to each other.

8. A friction bonding method as claimed in claim 1, wherein an initial friction bonding operation before the reduction or stop is performed by controlling the pressurization between the objects to be bonded to each other, and a final friction bonding operation after the reduction or stop is performed by controlling a distance between the objects to be bonded to each other.

9. A friction bonding method as claimed in claim 1, wherein an initial friction bonding operation before the reduction or stop is performed for a time shorter than a time of a final friction bonding operation after the reduction or stop.

10. A friction bonding method as claimed in claim 1, wherein an initial friction bonding operation before the reduction or stop is performed by controlling a distance between the objects to be bonded to each other, and on basis of control data obtained at the time, the distance between the objects to be bonded to each other is controlled during a final friction bonding operation after the reduction or stop.

11. A friction bonding method as claimed in claim 1, wherein an initial friction bonding operation before the reduction or stop is performed by controlling the pressurization between the objects to be bonded to each other, and on basis of control data obtained at the time, the pressurization between the objects to be bonded to each other is controlled during a final friction bonding operation after the reduction or stop.

12. A friction bonding method as claimed in claim 11, wherein the friction bonding operation is temporarily reduced or stopped partway when the metallic bonding portions are frictionally bonded to each other through the frictional contact between the metallic bonding portions by pressurizing and moving one object to be bonded of the two objects to be bonded relative to the other object to be bonded of the two objects to be bonded in a state in which the one object to be bonded is held by a holding tool with the metallic bonding portions of the objects to be bonded facing each other, an impedance of a ultrasonic horn connected to an oscillator attached onto the holding tool is monitored during an initial friction bonding operation before the reduction or stop when performing frictional bonding by the ultrasonic vibrations, and a final friction bonding operation after the reduction or stop is controlled in accordance with the monitored impedance.

13. A friction bonding method as claimed in claim 11, wherein the one object to be bonded of the two objects to be bonded is a semiconductor element, and the other object to be bonded of the two objects to be bonded is a magnetic disk reading suspension head constructed of a thin leaf spring.

14. A friction bonding method as claimed claim 1, wherein the friction bonding operation is temporarily reduced or stopped partway when the metallic bonding portions are frictionally bonded to each other by the frictional contact between the metallic bonding portions by pressurizing and relatively moving the semiconductor element that is one object to be bonded of the two objects to be bonded relative to the circuit forming body that is the other object to be bonded of the two objects to be bonded in a state in which the one object to be bonded is held by a holding tool with the metallic bonding portions of the objects to be bonded facing each other.

15. A friction bonding method as claimed in claim 14, wherein the holding tool is a suction tool, and the friction bonding operation is temporarily reduced or stopped partway when the metallic bonding portions are frictionally bonded to each other with the metallic bonding portions put into frictional contact with each other by sucking and holding the semiconductor element that is the one object to be bonded of the two objects to be bonded by the holding tool with the metallic bonding portions facing each other and pressurizing and relatively moving the one object to be bonded with respect to the circuit forming body that is the other object to be bonded of the two objects to be bonded.

16. A friction bonding method as claimed in claim 1, wherein the relative movement is performed by subjecting the semiconductor element that is the one object to be bonded of the two objects to be bonded to ultrasonic vibrations.

17. A friction bonding method as claimed in claim 15, wherein, when sucking and holding the semiconductor element that is the one object to be bonded by the suction tool, the one object to be bonded is sucked and held by being put in contact with and received by a pair of opposed taper surfaces that is formed on a suction surface of a suction nozzle and able to be brought in contact with an external edge portion of the one object to be bonded.

18. A friction bonding apparatus comprising:
   two bonding object handling units for holding the semiconductor element by means of a suction tool, holding a circuit forming body which are the two objects to be bonded, and positioning the semiconductor element and the circuit forming body so that their metal electrode portions that is a plurality of metallic bonding portions respectively face each other by holding the semiconductor element and the circuit forming body respectively;
   a relative movement unit for respectively bringing the plurality of opposed metallic bonding portions of the two objects to be bonded into frictional contact with each other by relatively moving the objects to be bonded held by the two bonding object handling units; and
   a control unit, which controls the holding and positioning of the objects to be bonded by the bonding object handling units and the relative movement of the bonding object handling units by the relative movement unit so as to respectively make the plurality of metallic bonding portions of the objects to be bonded held by the bonding object handling units face each other and brings the objects into frictional contact with each other by the relative movement for achievement of respective metallic bonding,
   the control unit temporarily reducing or stopping the friction bonding operation partway.

19. A friction bonding apparatus as claimed in claim 18, wherein movement of one of the bonding object handling units by the relative movement unit is performed by ultrasonic vibrations.

20. A friction bonding apparatus as claimed in claim 18, wherein one object to be bonded of the two objects to be bonded is handled by one bonding object handling unit of the two bonding object handling units, the one object to be bonded is an object to be bonded that has a frame portion and the metallic bonding portion in an inclined portion that extends from the frame portion into the frame portion and is inclined with respect to the frame portion,
   the one bonding object handling unit has a positioning section for positioning and holding the frame portion of the one object to be bonded,
   the positioning section can move into a unloading/loading position in which the frame portion of the one object to be bonded is held and guided along its conveyance surface and the one object to be bonded is loaded and unloaded and a bonding position in which the inclined portion of the one object to be bonded that holds and positions the frame portion is inclined so as to extend along the conveyance surface and the metallic bonding portion located at the inclined portion is subjected to metallic bonding,
   the one bonding object handling unit further comprises: a position switching unit for performing switching so that the positioning section is moved into the unloading/loading position and the bonding position; and
   a backup section for performing backup so that the inclined portion of the one object to be bonded positioned by the positioning section is supported from below when the positioning section is switched to the bonding position, and
   the control unit controls the position switching unit according to the loading, unloading, positioning, and bonding of the one object to be bonded, thereby switching the positioning section between the unloading/loading position and the bonding position.

21. A friction bonding apparatus as claimed in claim 20, wherein the positioning section has a pair of guide rails for conveying and guiding the one object to be bonded, the one object to be bonded is a spring leaf, the inclined portion is formed at a tip portion of the spring leaf extended inside the frame portion, and the positioning section is provided with: a pressurizing member that is supported by one guide rail of the pair of guide rails of the positioning section and able to move between a holding position in which the inclined portion owned by the spring leaf is held between the pressurizing member and the backup section and a holding release position in which the holding is released; and a switching unit that switches the pressurizing member into the holding position and the holding release position between the pressurizing member and the one guide rail, and
   the control unit controls the switching unit so as to position the pressurizing member in the holding position every time the one object to be bonded is received and positioned in the positioning section and in the holding release position every time the bonding operation ends.

22. A friction bonding apparatus as claimed in claim 21, wherein a plurality of spring leaves each of which is the one object to be bonded exist inside the frame portion,
   the pressurizing member is provided with a pressurizing leaf that can hold each spring leaf between the pressurizing member and the backup section while independently covering the spring leaf, the pressurizing leaf holds or releases the holding of the spring leaf, and each pressurizing leaf is provided with a through hole for exposing the metallic bonding portion of the inclined portion of each spring leaf to subject the metallic bonding portion to friction bonding.

23. A frictional bonding apparatus as claimed in claim 19, further comprising two bonding object handling units, one bonding object handling unit operable for performing temporary fixation by an initial frictional bonding operation until the reduction or stop of the frictional bonding, and the other boding object handling unit operable for performing regular fixation by a final frictional bonding operation of the semiconductor element and the circuit forming body after the bonding operation until the reduction or stop of the frictional bonding.

24. A frictional bonding apparatus as claimed in claim 23, wherein the one bonding object handling unit for performing the initial frictional bonding operation has a suction tool that has a suction hole for sucking the semiconductor element, and the other bonding object handling unit has an inclined tool that has an inclined surface capable of holding the semiconductor element.

* * * * *

UNITED STATES PATENT AND TRADEMARK OFFICE
CERTIFICATE OF CORRECTION

PATENT NO. : 6,706,130 B1
DATED : March 16, 2004
INVENTOR(S) : Shozo Minamitani et al.

It is certified that error appears in the above-identified patent and that said Letters Patent is hereby corrected as shown below:

Column 40,
Line 26, change "claim 11," to -- claim 16, --.
Line 42, change "claim 11," to -- claim 16, --.

Signed and Sealed this

Twentieth Day of July, 2004

JON W. DUDAS
*Acting Director of the United States Patent and Trademark Office*